US009292389B2

(12) United States Patent
Schirripa et al.

(10) Patent No.: US 9,292,389 B2
(45) Date of Patent: Mar. 22, 2016

(54) PRIORITIZING DATA RECONSTRUCTION IN DISTRIBUTED STORAGE SYSTEMS

(71) Applicant: Google Inc., Mountain View, CA (US)

(72) Inventors: Steven Robert Schirripa, Hazlet, NJ (US); Christian Eric Schrock, Cold Spring Harbor, NY (US); Robert Cypher, Saratoga, CA (US); Sean Quinlan, Palo Alto, CA (US)

(73) Assignee: Google Inc., Mountain View, CA (US)

( * ) Notice: Subject to any disclaimer, the term of this patent is extended or adjusted under 35 U.S.C. 154(b) by 200 days.

(21) Appl. No.: 14/169,274

(22) Filed: Jan. 31, 2014

(65) Prior Publication Data

US 2015/0220398 A1 Aug. 6, 2015

(51) Int. Cl.
*G06F 11/14* (2006.01)
(52) U.S. Cl.
CPC ........ *G06F 11/1469* (2013.01); *G06F 11/1402* (2013.01)
(58) Field of Classification Search
CPC .................................................. G06F 11/1469
See application file for complete search history.

(56) References Cited

U.S. PATENT DOCUMENTS

| 6,516,425 | B1 | | 2/2003 | Belhadj et al. |
| 7,065,618 | B1 | * | 6/2006 | Ghemawat ........ G06F 17/30215 707/999.201 |
| 7,107,419 | B1 | * | 9/2006 | Ghemawat ........ G06F 17/30067 707/999.202 |
| 7,222,119 | B1 | * | 5/2007 | Ghemawat ........ G06F 17/30171 |
| 7,653,668 | B1 | * | 1/2010 | Shelat ................. G06F 11/2094 707/610 |
| 8,341,457 | B2 | | 12/2012 | Spry et al. |
| 8,504,518 | B1 | | 8/2013 | Ghemawat et al. |
| 2009/0217137 | A1 | | 8/2009 | Reid et al. |
| 2011/0066803 | A1 | | 3/2011 | Arakawa et al. |
| 2011/0099266 | A1 | * | 4/2011 | Calder ...................... G06F 8/65 709/224 |

(Continued)

FOREIGN PATENT DOCUMENTS

JP 2008242524 A 10/2008
WO WO-2012147087 A1 11/2012

OTHER PUBLICATIONS

CC. Huang, M. Chen, and J. Li, "Pyramid Codes: Schemes to Trade Space for Access Effciency in Reliable Data Storage Systems," Proc. of IEEE NCA, Cambridge, MA, Jul. 2007.

(Continued)

*Primary Examiner* — William Spieler
(74) *Attorney, Agent, or Firm* — Honigman Miller Schwartz and Cohn LLP

(57) ABSTRACT

A method of prioritizing data for recovery in a distributed storage system includes, for each stripe of a file having chunks, determining whether the stripe comprises high-availability chunks or low-availability chunks and determining an effective redundancy value for each stripe. The effective redundancy value is based on the chunks and any system domains associated with the corresponding stripe. The distributed storage system has a system hierarchy including system domains. Chunks of a stripe associated with a system domain in an active state are accessible, whereas chunks of a stripe associated with a system domain in an inactive state are inaccessible. The method also includes reconstructing substantially immediately inaccessible, high-availability chunks having an effective redundancy value less than a threshold effective redundancy value and reconstructing the inaccessible low-availability and other inaccessible high-availability chunks, after a threshold period of time.

22 Claims, 18 Drawing Sheets

(56) References Cited

U.S. PATENT DOCUMENTS

2011/0225453 A1    9/2011   Spry et al.
2012/0131025 A1    5/2012   Cheung et al.
2013/0132967 A1    5/2013   Soundararajan et al.

OTHER PUBLICATIONS

Erasure Coding in Windows Azure Storage.
International Search Report and Written Opinion for PCT application No. PCT/US2015/012572 dated Apr. 30, 2015.

* cited by examiner

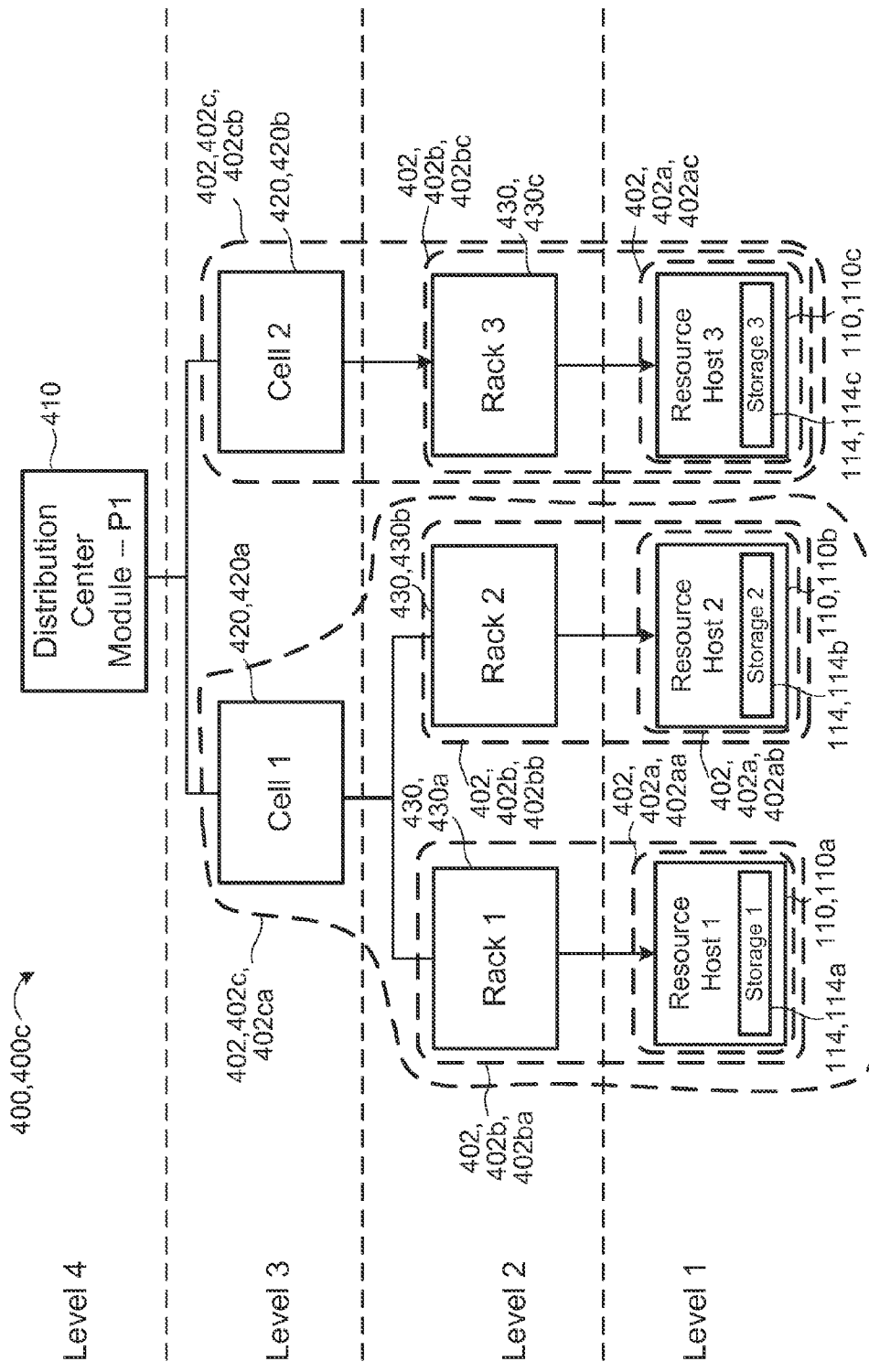

PRIORITIZING DATA RECONSTRUCTION IN DISTRIBUTED STORAGE SYSTEMS

TECHNICAL FIELD

This disclosure relates to prioritizing data reconstruction in distributed storage systems.

BACKGROUND

A distributed system generally includes many loosely coupled computers, each of which typically includes a computing resource (e.g., one or more processors) and/or storage resources (e.g., memory, flash memory, and/or disks). A distributed storage system overlays a storage abstraction (e.g., key/value store or file system) on the storage resources of a distributed system. In the distributed storage system, a server process running on one computer can export that computer's storage resources to client processes running on other computers. Remote procedure calls (RPC) may transfer data from server processes to client processes. Alternatively, Remote Direct Memory Access (RDMA) primitives may be used to transfer data from server hardware to client processes.

SUMMARY

One aspect of the disclosure provides a method of prioritizing data for recovery in a distributed storage system. The method includes, for each stripe of a file that includes a plurality of stripes having chunks, determining, using a data processing device, whether the stripe includes high-availability chunks or low-availability chunks and determining, using the data processing device, an effective redundancy value for each stripe of the file. The effective redundancy value is based on the chunks and any system domains associated with the corresponding stripe. The distributed storage system has a system hierarchy including system domains. Moreover, each system domain has an active state or an inactive state. Chunks of a stripe associated with a system domain in the active state are accessible, whereas chunks of a stripe associated with a system domain in the inactive state are inaccessible. The system domain may enter the inactive state during scheduled maintenance, unscheduled failures, or other reasons. When chunks of a stripe become inaccessible, the method includes reconstructing substantially immediately, using the data processing device, inaccessible, high-availability chunks having an effective redundancy value less than a threshold effective redundancy value. Moreover, when chunks of a stripe become inaccessible, the method also includes reconstructing after a threshold period of time: 1) inaccessible, low-availability chunks; and 2) inaccessible, high-availability chunks having an effective redundancy value greater than or equal to the threshold effective redundancy. Therefore, certain high-availability chunks at high risk of becoming lost (based on the effective redundancy value) receive relatively quicker reconstruction than low-availability chunks or other high-availability chunks that are not at high risk of becoming lost.

Implementations of the disclosure may include one or more of the following features. In some implementations, the method further includes updating the effective redundancy value for each stripe of the file associated with a system domain when the system domain is in the inactive state. The threshold period of time may be between about 15 minutes and about 30 minutes. Other threshold periods are possible as well.

The system hierarchy may include system levels, such as first, second, third, and fourth system levels. The first system level corresponds to host machines of data processing devices, non-transitory memory devices, or network interface controllers. Each host machine has a system domain. The second system level corresponds to power deliverers, communication deliverers, or cooling deliverers of racks housing the host machines. Each power deliverer, communication deliverer, or cooling deliverer of the rack has a system domain. The third system level corresponds to power deliverers, communication deliverers, or cooling deliverers of cells having associated racks. Each power deliverer, communication deliverer, or cooling deliverer of the cell has a system domain. The fourth system level corresponds to a distribution center module of the cells, each distribution center module has a system domain.

In some examples, for each stripe, the method includes determining the effective redundancy value for each system level. Determining the effective redundancy value for a replicated stripe having replica chunks includes identifying a number of unique system domains having at least one available replica chunk at a corresponding system level. Determining the effective redundancy value for an encoded stripe having data chunks and code chunks at the second system level includes identifying a number of unique system domains within the second system level capable of being inactive while maintaining data accessibility. In addition, determining the effective redundancy value for an encoded stripe having data chunks and code chunks at the third or fourth system level includes identifying a system domain within the third or fourth level capable of being inactive while maintaining data accessibility and having the largest number of chunks compared to the remaining system domains. Additionally, when more than one system domains has the largest number of chunks, the method includes randomly selecting one of the system domains.

In some implementations, determining the effective redundancy value for a nested code stripe having data chunks, code-check chunks, and word-check chunks further includes determining one of a column-effective redundancy or a stripe-effective redundancy. Determining a column-effective redundancy includes identifying a number of unique chunks within a column capable of being reconstructed from other chunks within the column; and determining a stripe-effective redundancy including identifying a number of unique chunks within a stripe capable of being reconstructed from other chunks within the stripe.

Another aspect of the disclosure provides a method of prioritizing data for recovery in a distributed storage system. The method includes determining, using a computing processor, an effective redundancy value for each stripe of a file, the file including stripes having chunks, the effective redundancy value based on the chunks and any system domains associated with the corresponding stripe, the distributed storage system having a system hierarchy including system domains, each system domain having an active state or an inactive state. When a system domain is in the inactive state, the method includes updating the effective redundancy value for each stripe of the file associated with that system domain. In addition, the method includes causing reconstruction of a stripe when its effective redundancy value is less than a threshold effective redundancy value.

In some implementations, the system hierarchy includes a first, a second, a third, and a fourth level. The first system level corresponds to host machines of data processing devices, non-transitory memory devices, or network interface controllers. Each host machine has a system domain. The second system level corresponds to power deliverers, communication deliverers, or cooling deliverers of racks housing the host machines. Each power deliverer, communication deliverer, or cooling deliverer of the rack has a system domain. The third system level corresponds to power deliverers, communication deliverers, or cooling deliverers of cells having associated racks. Each power deliverer, communication deliverer, or cooling deliverer of the cell having a system domain. The fourth system level corresponds to a distribution center module of the cells, each distribution center module having a system domain. In some examples, the method further includes, for each stripe, determining the effective redundancy value for each system level.

In some examples, determining the effective redundancy value for a replicated stripe having replica chunks includes identifying a number of unique system domains having at least one available replica chunk at a corresponding system level. Determining the effective redundancy value for an encoded stripe having data chunks and code chunks at the second system level includes identifying a number of unique system domains within the second system level capable of being inactive while maintaining data accessibility. In some examples, determining the effective redundancy value for an encoded stripe having data chunks and code chunks at the third or fourth system level includes identifying a system domain within the third or fourth level capable of being inactive while maintaining data accessibility and having the largest number of chunks compared to the remaining system domains. When more than one system domains has the largest number of chunks, the method includes randomly selecting one of the system domains.

In some implementations, determining the effective redundancy value for a nested code stripe having data chunks, code-check chunks, and word-check chunks includes determining one of a column-effective redundancy or a stripe-effective redundancy. Determining a column-effective redundancy includes identifying a number of unique chunks within a column capable of being reconstructed from other chunks within the column, and determining a stripe-effective redundancy includes identifying a number of unique chunks within a stripe capable of being reconstructed from other chunks within the stripe.

In some implementations, the method includes determining whether the stripe includes high-availability chunks or low-availability chunks. When chunks of the stripe become inaccessible, the method includes reconstructing substantially immediately, using the data processing device, inaccessible, high-availability chunks having an effective redundancy value less than a threshold effective redundancy value. Moreover, when chunks of a stripe become inaccessible, the method also includes reconstructing a threshold period of time: 1) inaccessible, low-availability chunks; and 2) inaccessible, high-availability chunks having an effective redundancy value greater than or equal to the threshold effective redundancy. The threshold period of time may be between about 15 minutes and about 30 minutes. Other threshold periods are possible as well.

Yet another aspect of the disclosure provides a system for prioritizing data for recovery in a distributed storage system. The system includes memory hosts, each memory host having non-transitory memory and a computer processor in communication with the memory hosts. The computer processor executes instructions to manage striping of files across the memory hosts, each file includes stripes having chunks. For each stripe of a file having a plurality of stripes having chunks, the computer processor determines using a data processing device and whether the stripe includes high-availability chunks or low-availability chunks. In addition, the computer processor determines an effective redundancy value for each stripe of the file. The effective redundancy value is based on the chunks and any system domains associated with the corresponding stripe. The distributed storage system has a system hierarchy that includes system domains where each system domain has an active state or an inactive state. Chunks of a stripe associated with a system domain in the active state are accessible, and chunks of a stripe associated with a system domain in the inactive state are inaccessible.

When chunks of a stripe become inaccessible, the computer processor causes reconstruction substantially immediately of inaccessible, high-availability chunks having an effective redundancy value less than a threshold effective redundancy value. Moreover, when chunks of a stripe become inaccessible, the computer processor causes reconstruction after a threshold period of time of: 1) inaccessible, low-availability chunks; and 2) inaccessible, high-availability chunks having an effective redundancy value greater than or equal to the threshold effective redundancy.

The computer processor causes reconstruction of inaccessible, high-availability chunks that have an effective redundancy value less than a threshold effective redundancy value and causes reconstruction of the remaining inaccessible chunks, using the data processing device, after a threshold period of time following an inaccessibility time point of the inaccessible chunks. The remaining inaccessible chunks may be high-availability and/or low-availability chunks.

In some implementations, the computer processor updates the effective redundancy value for each stripe of the file associated with a system domain when the system domain is in the inactive state. The threshold period of time may be between about 15 minutes and about 30 minutes.

In some examples, the system hierarchy includes first through fourth system levels. The first system level corresponds to host machines of data processing devices, non-transitory memory devices, or network interface controllers. Each host machine has a system domain. The second system level corresponds to power deliverers, communication deliverers, or cooling deliverers of racks housing the host machines. Each power deliverer, communication deliverer, or cooling deliverer of the rack has a system domain. The third system level corresponds to power deliverers, communication deliverers, or cooling deliverers of cells having associated racks. Each power deliverer, communication deliverer, or cooling deliverer of the cell has a system domain. The fourth system level corresponds to a distribution center module of the cells, each distribution center module has a system domain. The computer processor determines for each stripe the effective redundancy value for each system level.

The computer processor may determine the effective redundancy value for a replicated stripe having replica chunks by identifying a number of unique system domains having at least one available replica chunk at a corresponding system level. In some examples, the computer processor determines the effective redundancy value for an encoded stripe having data chunks and code chunks at the second system level by identifying a number of unique system domains within the second system level capable of being inactive while maintaining data accessibility. The computer processor may determine the effective redundancy value for an encoded stripe having data chunks and code chunks at the third or fourth system level by identifying a system domain within the third or fourth level capable of being inactive while maintaining data accessibility and having the largest number of chunks compared to the remaining system domains. When more than one system domains has the largest number of chunks, the computer processor randomly selects one of the system domains.

In some implementations, the computer processor determines the effective redundancy value for a nested code stripe having data chunks, code-check chunks, and word-check chunks by determining one of a column-effective redundancy or a stripe-effective redundancy. The computer processor determines a column-effective redundancy by identifying a number of unique chunks within a column capable of being reconstructed from other chunks within the column and determines a stripe-effective redundancy by identifying a number of unique chunks within a stripe capable of being reconstructed from other chunks within the stripe.

The details of one or more implementations of the disclosure are set forth in the accompanying drawings and the description below. Other aspects, features, and advantages will be apparent from the description and drawings, and from the claims.

DESCRIPTION OF DRAWINGS

FIGS. 4A-4E are schematic views of exemplary system hierarchies.

Like reference symbols in the various drawings indicate like elements.

DETAILED DESCRIPTION

Figure 1A:
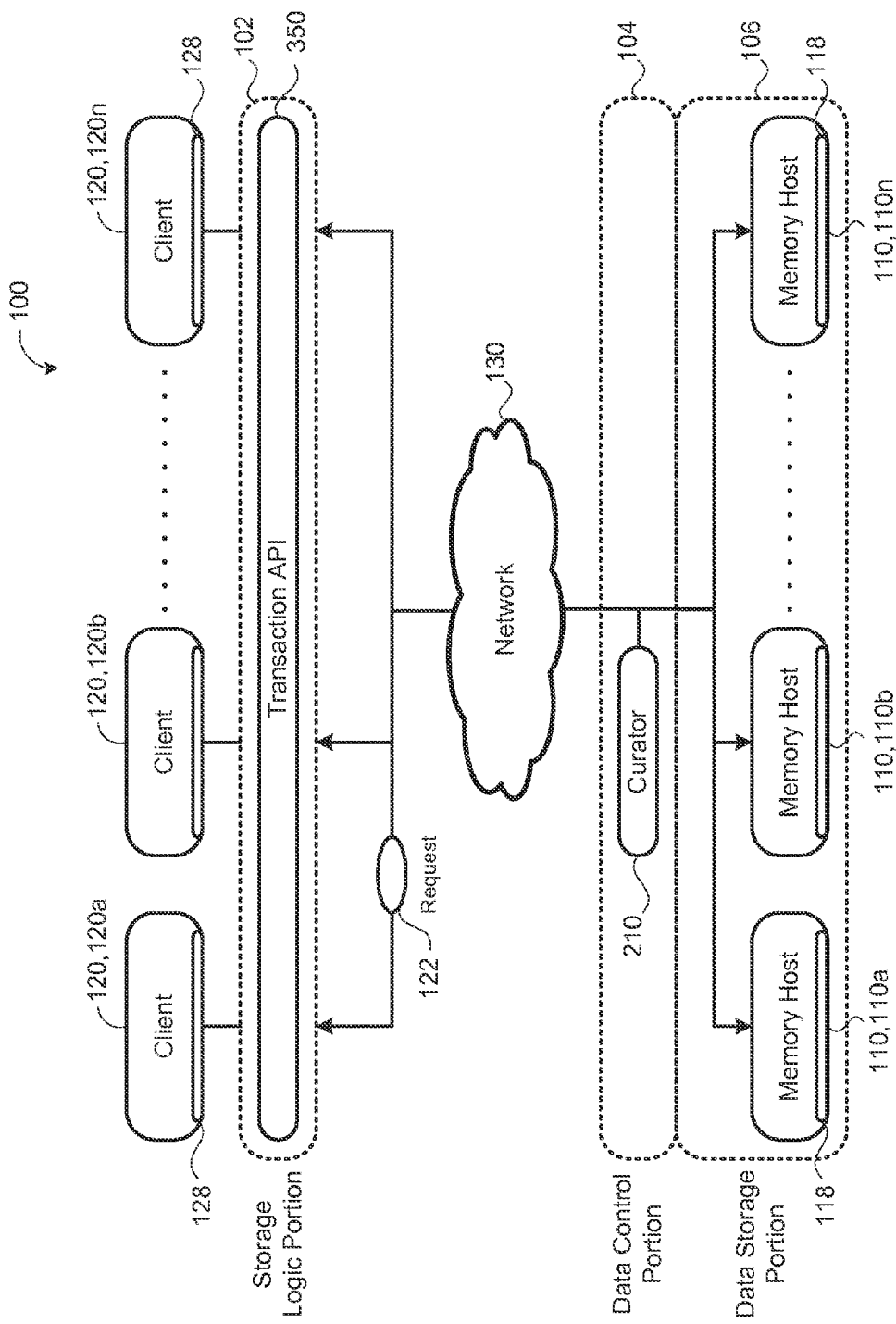
FIG. 1A is a schematic view of an exemplary distributed storage system.
Figure 1B:
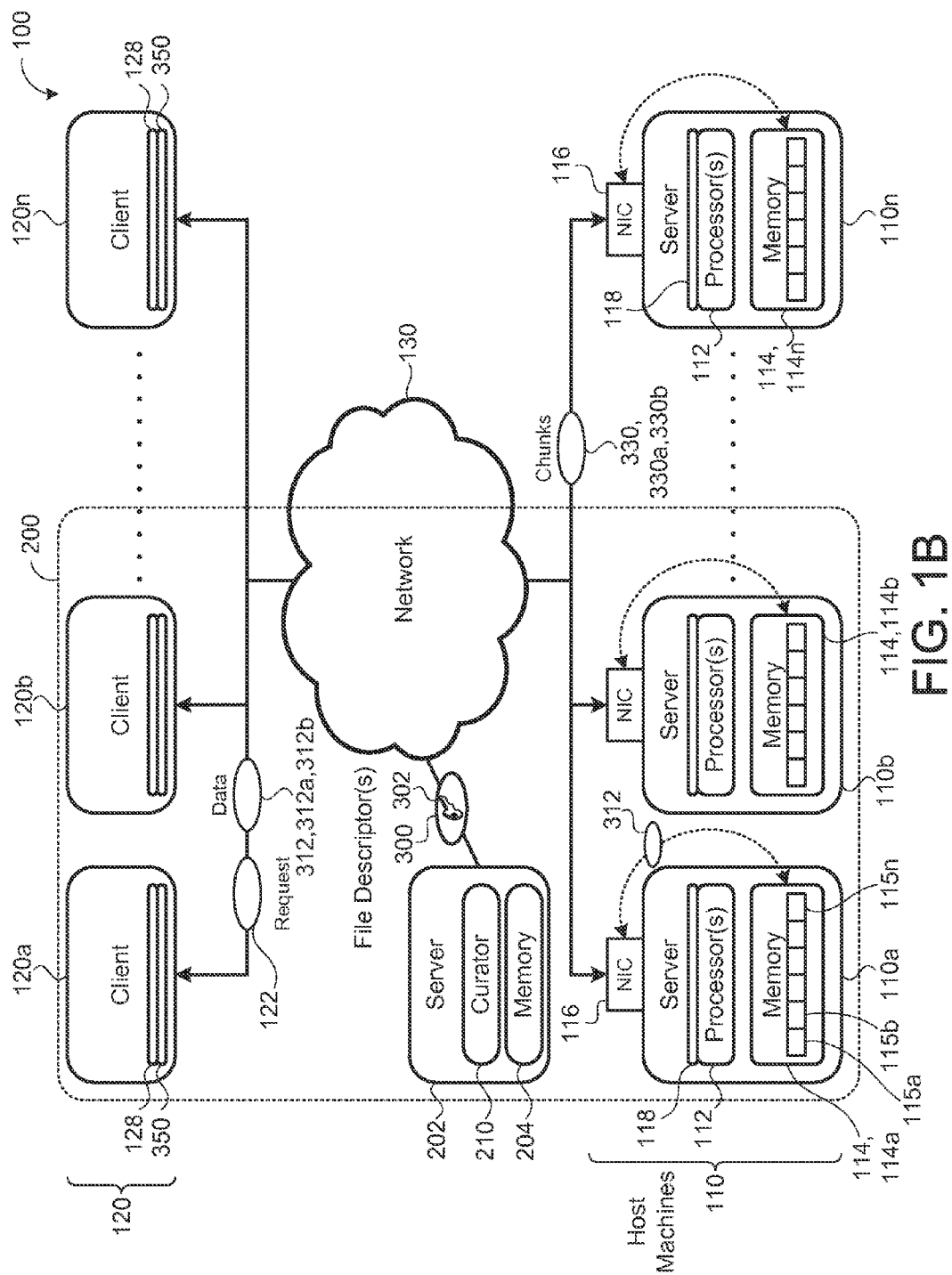
FIG. 1B is a schematic view of an exemplary distributed storage system having a cell of memory resources managed by a curator.

Referring to FIGS. 1A-1B, in some implementations, a distributed storage system 100 includes loosely coupled resource hosts 110, 110a-n (e.g., computers or servers), each having a computing resource 112 (e.g., one or more processors or central processing units (CPUs)) in communication with storage resources 114 (e.g., memory, flash memory, dynamic random access memory (DRAM), phase change memory (PCM), and/or disks) that may be used for caching data. A storage abstraction (e.g., key/value store or file system) overlain on the storage resources 114 allows scalable use of the storage resources 114 by one or more clients 120, 120a-n. The clients 120 may communicate with the resource hosts 110 through a network 130 (e.g., via RPC).

The distributed storage systems 100 may include multiple layers of redundancy where data 312 is replicated and/or encoded and stored in multiple data centers. Data centers house computer systems and their associated components, such as telecommunications and storage systems 100. Data centers usually include backup power supplies, redundant communications connections, environmental controls (to maintain a constant temperature), and security devices. Data centers may be large industrial scale operations that use a great amount of electricity (e.g., as much as a small town). Data centers may be located in different geographical locations (e.g., different cities, different countries, and different continents). In some examples, the data centers, or portions thereof, requires maintenance (e.g., due to a power outage or disconnecting a portion of the storage system 100 for replacing parts, or a system failure, or a combination thereof). The data 312 stored in these data centers, and in particular, the distributed storage system 100 may be unavailable to users/clients 120 during the maintenance period resulting in the impairment or halt of a user's operations. During maintenance (or unplanned failures) of the distributed storage system 100, some data 312 has a higher risk of becoming fully unavailable than other data 312. It is desirable to segment the data population into high-availability data 312 and low-availability data 312 and determine which data 312 is more at risk of loss due to the maintenance, and then recover/replicate that data 312 without recovering all or most of the remaining data 312, which would lead to inefficiencies.

In some implementations, the distributed storage system 100 is "single-sided," eliminating the need for any server jobs for responding to remote procedure calls (RPC) from clients 120 to store or retrieve data 312 on their corresponding resource hosts 110 and may rely on specialized hardware to process remote requests 122 instead. "Single-sided" refers to the method by which most of the request processing on the resource hosts 110 may be done in hardware rather than by software executed on CPUs 112 of the resource hosts 110. Rather than having a processor 112 of a resource host 110 (e.g., a server) execute a server process 118 that exports access of the corresponding storage resource 114 (e.g., non-transitory memory) to client processes 128 executing on the clients 120, the clients 120 may directly access the storage resource 114 through a network interface controller (NIC) 116 of the resource host 110. In other words, a client process 128 executing on a client 120 may directly interface with one or more storage resources 114 without requiring execution of a routine of any server processes 118 executing on the computing resources 112. This single-sided distributed storage architecture offers relatively high-throughput and low latency, since clients 120 can access the storage resources 114 without interfacing with the computing resources 112 of the resource hosts 110. This has the effect of decoupling the requirements for storage 114 and CPU cycles that typical two-sided distributed storage systems 100 carry. The single-sided distributed storage system 100 can utilize remote storage resources 114 regardless of whether there are spare CPU cycles on that resource host 110; furthermore, since single-sided operations do not contend for server CPU 112 resources, a single-sided system can serve cache requests 122 with very predictable, low latency, even when resource hosts 110 are running at high CPU utilization. Thus, the single-sided distributed storage system 100 allows higher utilization of both cluster storage 114 and CPU 112 resources than traditional two-sided systems, while delivering predictable, low latency.

In some implementations, the distributed storage system 100 includes a storage logic portion 102, a data control portion 104, and a data storage portion 106. The storage logic portion 102 may include a transaction application programming interface (API) 350 (e.g., a single-sided transactional system client library) that is responsible for accessing the underlying data, for example, via RPC or single-sided operations. The data control portion 104 may manage allocation and access to storage resources 114 with tasks, such as allocating storage resources 114, registering storage resources 114 with the corresponding network interface controller 116, setting up connections between the client(s) 120 and the resource hosts 110, handling errors in case of machine failures, etc. The data storage portion 106 may include the loosely coupled resource hosts 110, 110a-n.

The distributed storage system 100 may store data 312 in dynamic random access memory (DRAM) 114 and serve the data 312 from the remote hosts 110 via remote direct memory access (RDMA)-capable network interface controllers 116. A network interface controller 116 (also known as a network interface card, network adapter, or LAN adapter) may be a computer hardware component that connects a computing resource 112 to the network 130. Both the resource hosts 110a-n and the client 120 may each have a network interface controller 116 for network communications. A host process 118 executing on the computing processor 112 of the resource host 110 registers a set of remote direct memory accessible regions 115a-n of the memory 114 with the network interface controller 116. The host process 118 may register the remote direct memory accessible regions 115a-n of the memory 114 with a permission of read-only or read/write. The network interface controller 116 of the resource host 110 creates a client key 302 for each registered memory region 115a-n.

The single-sided operations performed by the network interface controllers 116 may be limited to simple reads, writes, and compare-and-swap operations, none of which may be sophisticated enough to act as a drop-in replacement for the software logic implemented by a traditional cache server job to carry out cache requests and manage cache policies. The transaction API 350 translates commands, such as look-up or insert data commands, into sequences of primitive network interface controller operations. The transaction API 350 interfaces with the data control and data storage portions 104, 106 of the distributed storage system 100.

The distributed storage system 100 may include a co-located software process to register memory 114 for remote access with the network interface controllers 116 and set up connections with client processes 128. Once the connections are set up, client processes 128 can access the registered memory 114 via engines in the hardware of the network interface controllers 116 without any involvement from software on the local CPUs 112 of the corresponding resource hosts 110.

Referring to FIG. 1B, in some implementations, the distributed storage system 100 includes multiple cells 200, each cell 200 including resource hosts 110 and a curator 210 in communication with the resource hosts 110. The curator 210 (e.g., process) may execute on a computing processor 202 (e.g., server having a non-transitory memory 204) connected to the network 130 and manage the data storage (e.g., manage a file system stored on the resource hosts 110), control data placements, and/or initiate data recovery. Moreover, the curator 210 may track an existence and storage location of data 312 on the resource hosts 110. Redundant curators 210 are possible. In some implementations, the curator(s) 210 track the striping of data 312 across multiple resource hosts 110 and the existence and/or location of multiple copies of a given stripe for redundancy and/or performance. In computer data storage, data striping is the technique of segmenting logically sequential data 312, such as a file 310 (FIG. 2), in a way that accesses of sequential segments are made to different physical storage devices 114 (e.g., cells 200 and/or resource hosts 110). Striping is useful when a processing device requests accesses to data 312 more quickly than a storage device 114 can provide access. By performing segment accesses on multiple devices, multiple segments can be accessed concurrently. This provides more data access throughput, which avoids causing the processor to idly wait for data accesses.

In some implementations, the transaction API 350 interfaces between a client 120 (e.g., with the client process 128) and the curator 210. In some examples, the client 120 communicates with the curator 210 through one or more remote procedure calls (RPC). In response to a client request 122, the transaction API 350 may find the storage location of certain data 312 on resource host(s) 110 and obtain a key 302 that allows access to the data 312. The transaction API 350 communicates directly with the appropriate resource hosts 110 (via the network interface controllers 116) to read or write the data 312 (e.g., using remote direct memory access). In the case that a resource host 110 is non-operational, or the data 312 was moved to a different resource host 110, the client request 122 fails, prompting the client 120 to re-query the curator 210.

Figure 2:
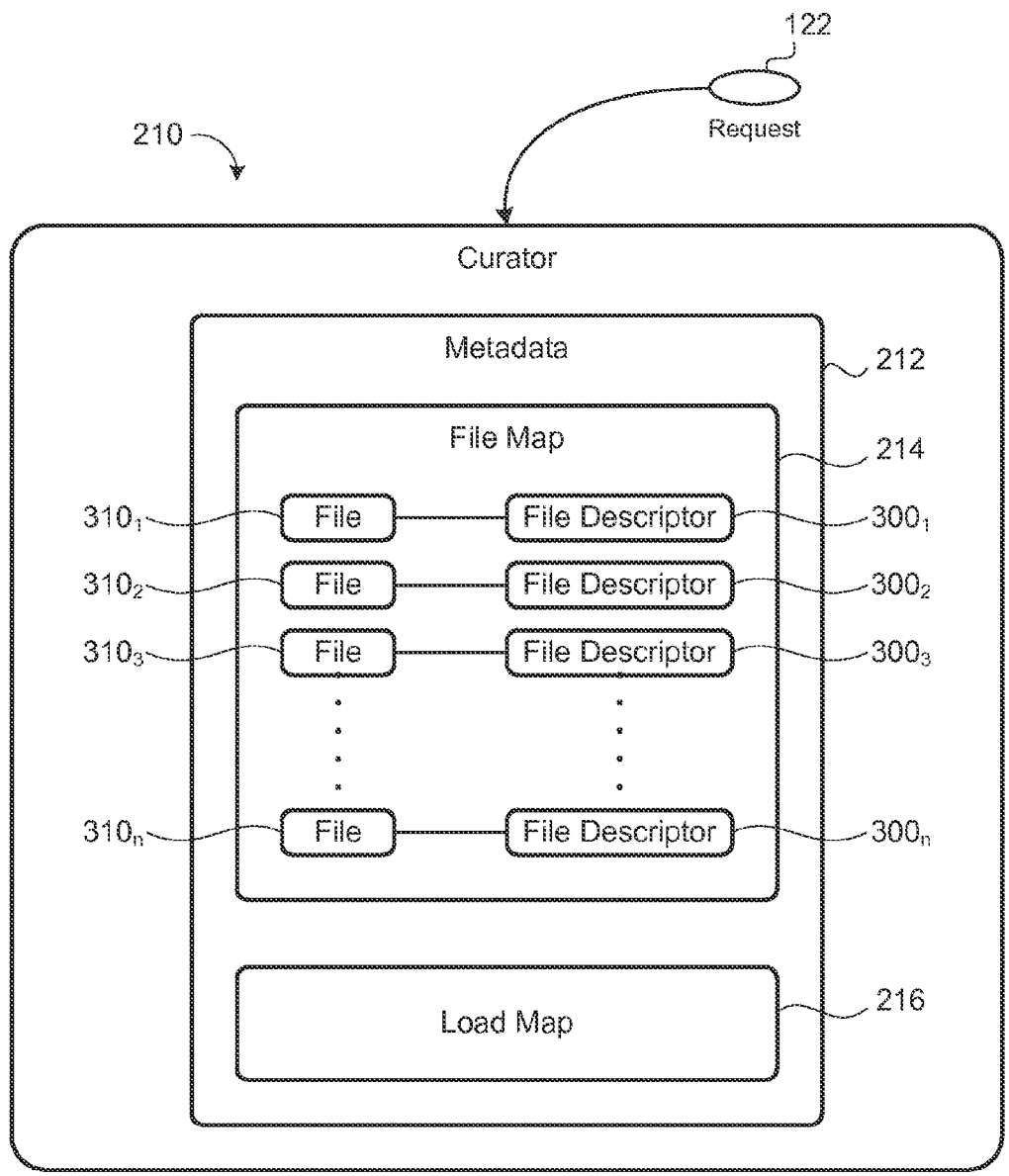
FIG. 2 is a schematic view of an exemplary curator for a distributed storage system.

Referring to FIG. 2, in some implementations, the curator 210 stores and manages file system metadata 212. The metadata 212 may include a file map 214 that maps files $310_{1-n}$ to file descriptors $300_{1-n}$. The curator 210 may examine and modify the representation of its persistent metadata 212. The curator 210 may use three different access patterns for the metadata 212: read-only; file transactions; and stripe transactions. Referring to FIGS. 2 and 3A-3C, in some implementations, file descriptors $300_{1-n}$ stored by the curator 210 contain metadata 212, such as the file map 214, which maps the stripes 320a-n to data chunks 330nD and code chunks 330nC stored on the memory hosts 110. To open a file 310, a client 120 sends a request 122 to the curator 210, which returns a file descriptor 300. The client 120 uses the file descriptor 300 to translate file chunk offsets to remote memory locations 115a-n. The file descriptor 300 may include a client key 302 (e.g., a 32-bit key) that is unique to a chunk 330 on a memory host 110 and is used to RDMA-read that chunk 330. After the client 120 loads the file descriptor 300, the client 120 may access the data 312 of a file 310 via RDMA or another data retrieval method.

The curator 210 may maintain status information for all memory hosts 110 that are part of the cell 200. The status information may include capacity, free space, load on the memory host 110, latency of the memory host 110 from a client's point of view, and a current state. The curator 210 may obtain this information by querying the memory hosts 110 in the cell 200 directly and/or by querying a client 120 to gather latency statistics from a client's point of view. In some examples, the curator 210 uses the memory host status information to make rebalancing, draining, recovery decisions, and allocation decisions.

The curator(s) 210 may allocate chunks 330 in order to handle client requests 122 for more storage space in a file 310 and for rebalancing and recovery. In some examples, the processor 202 replicates chunks 330 among the storage devices 114 differently than distributing the data chunks 330nD and the code chunks 330nC among the storage devices 114. The curator 210 may maintain a load map 216 of memory host load and liveliness. In some implementations, the curator 210 allocates a chunk 330 by generating a list of candidate memory hosts 110 and sends an allocate chunk request to each of the candidate memory hosts 110. If the memory host 110 is overloaded or has no available space, the memory host 110 can deny the request 122. In this case, the curator 210 selects a different memory host 110. Each curator 210 may continuously scan its designated portion of the file namespace, examining all the metadata 212 every minute or so. The curator 210 may use the file scan to check the integrity of the metadata 212, determine work that needs to be performed, and/or to generate statistics. The file scan may operate concurrently with other operations of the curator 210. The scan itself may not modify the metadata 212, but schedules work to be done by other components of the system and computes statistics.

Referring to FIGS. 3A-3H, data 312 may be one or more files 310, where each file 310 has a specified replication level 311 and/or error-correcting code 313. The curator 210 may divide each file 310 into a collection of stripes 320, with each stripe 320 being encoded independently from the remaining stripes 320. For a replicated file 310 (FIG. 3A), each stripe 320 is a single logical chunk that the curator 210 replicates as stripe replicas 330n and stores on multiple storage resources 114. In that scenario, a stripe replica 330n is also referred to as a chunk 330. For an erasure encoded file 310 (FIG. 3B), each stripe 320 consists of multiple data chunks 330nD and non-data chunks 330nC (e.g., code chunks) that the curator 210 places on multiple storage resources 114, where the collection of data chunks 330nD and non-data chunks 330nC forms a single code word. In general, the curator 210 may place each stripe 320 on storage resources 114 independently of how the other stripes 320 in the file 310 are placed on the storage resources 114. The error-correcting code 313 adds redundant data, or parity data to a file 310, so that the file 310 can later be recovered by a receiver even when a number of errors (up to the capability of the code being used) were introduced. The error-correcting code 313 is used to maintain data 312 integrity in storage devices, to reconstruct data 312 for performance (latency), or to more quickly drain machines.

Figure 3A:
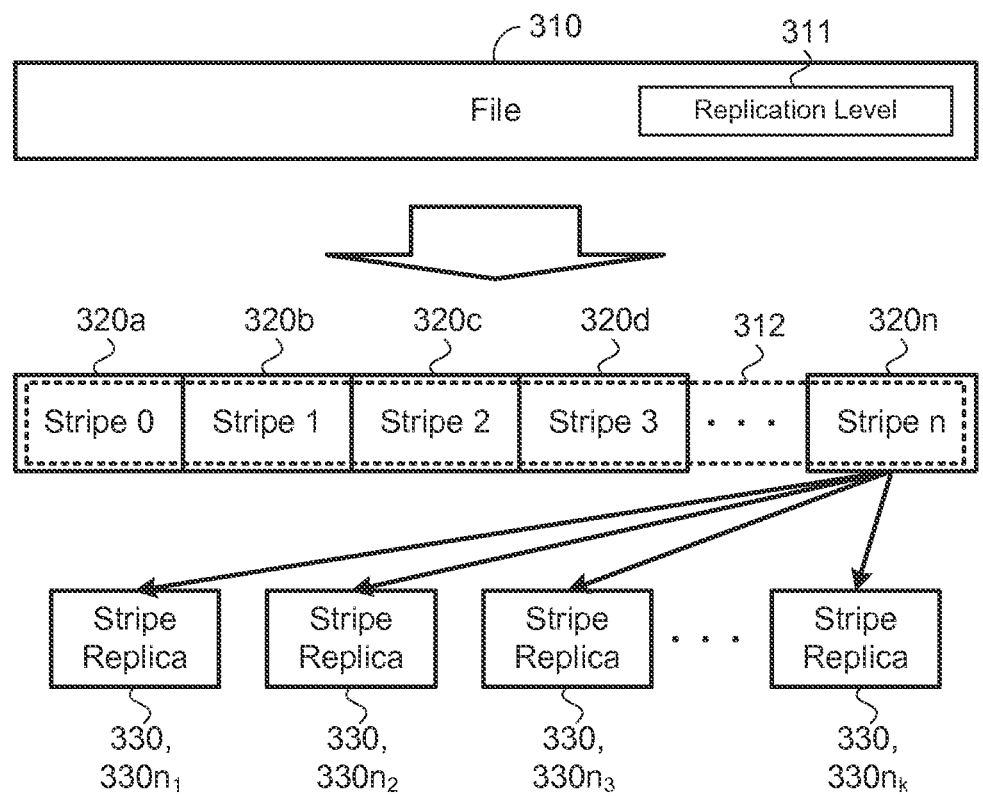
FIG. 3A is a schematic view of an exemplary file split into replicated stripes.
Figure 3B:
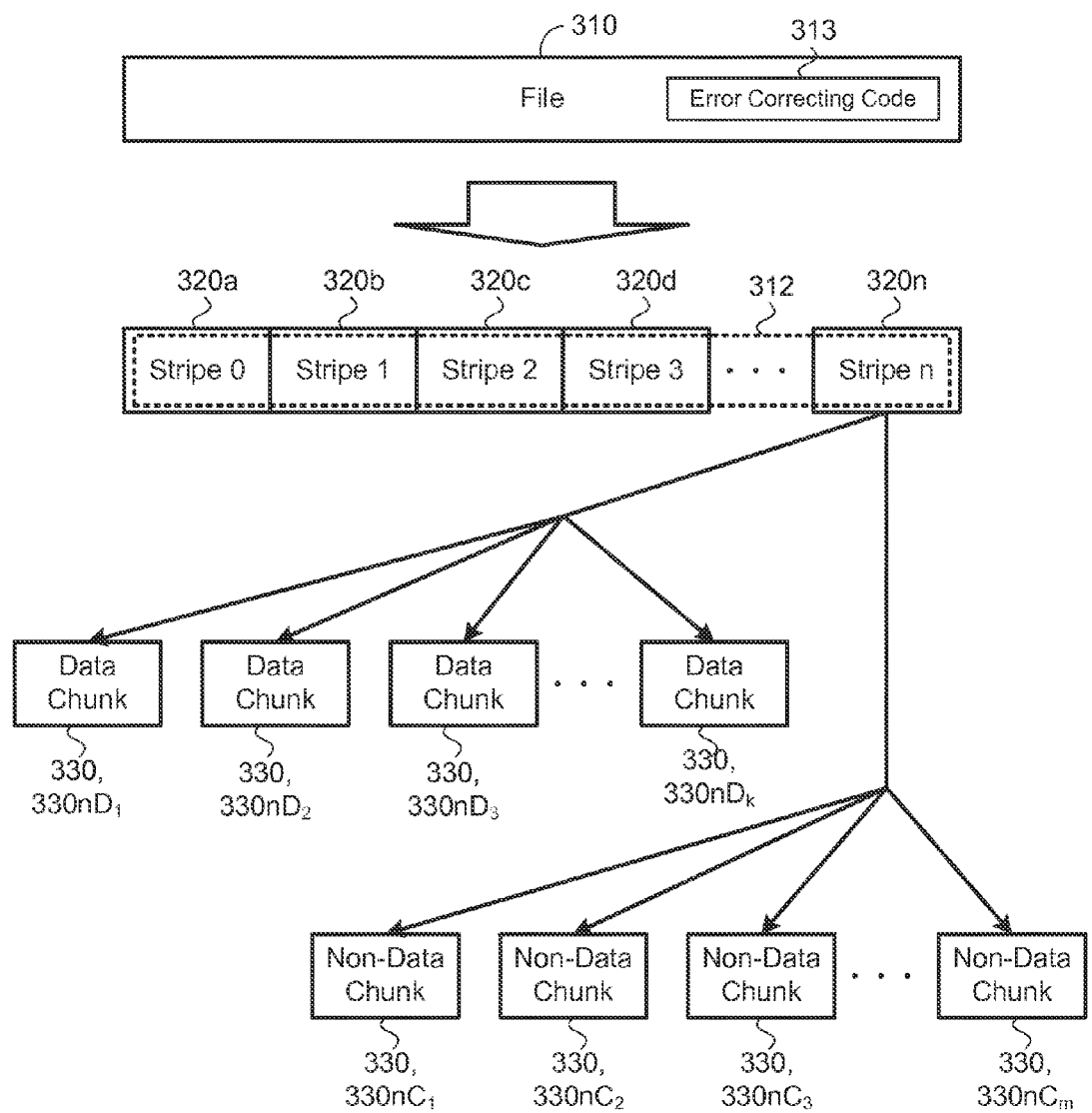
FIG. 3B is a schematic view of an exemplary file split into data chunks and non-data chunks.

Referring to FIG. 3B, each stripe 320 is divided into data-chunks 330nD and non-data chunks 330nC based on an encoding level, e.g., Reed-Solomon Codes (FIG. 3C), nested codes (FIGS. 3D-3H), or other erasure coding. The non-data chunks 330nC may be code chunks 330nC (e.g., for Reed Solomon codes). In other examples, the non-data chunks 330nC may be code-check chunks 330nCC, word-check chunks 330nWC, and code-check-word-check chunks 330nCCWC (for nested coding).

A data chunk 330nD is a specified amount of data 312. In some implementations, a data chunk 330nD is a contiguous portion of data 312 from a file 310. In other implementations, a data chunk 330nD is one or more non-contiguous portions of data 312 from a file 310. For example, a data chunk 330nD can be 256 bytes or other units of data 312.

A damaged chunk 330 (e.g., data chunk 330nD or non-data chunk 330nC) is a chunk 330 containing one or more errors. Typically, a damaged chunk 330 is identified using an error detecting code 313. For example, a damaged chunk 330 can be completely erased (e.g., if the chunk 330 was stored in a hard drive destroyed in a hurricane), or a damaged chunk 330 can have a single bit flipped. A healthy chunk 330 is a chunk 330 that is not damaged. A damaged chunk 330 can be damaged intentionally, for example, where a particular resource host 110 is shut down for maintenance. A damaged chunk may be a missing or unavailable chunk. In that case, damaged chunks 330 can be identified by identifying chunks 330 that are stored at resource hosts 110 that are being shut down. In some implementations, damaged chunks 330 may be recovered using healthy chunks 330. damaged chunks (e.g., data chunks 330nD or non-data chunks 330nC) may be damaged due to various reasons. Damaged chunks 330 within a stripe 320 may be recovered from the healthy chunks 330. The non-data chunks 330nC of a file 310 include an error-correcting code chunk 313. The error-correcting code chunks 313 include a chunk 330 of data 312 based on one or more data-chunks 330nD. In some implementations, each code chunk 330nC is the same specified size (e.g., 256 bytes) as the data chunks 330nD. The code chunks 330nC are generated using an error-correcting code 313, e.g., a Maximal Distance Separable (MDS) code. Examples of MDS codes include Reed-Solomon codes. Various techniques can be used to generate the code chunks 330nC. In general, any error-correcting code 313 can be used that can reconstruct d data chunks 330nD from any set of d unique, healthy chunks 330 (either data chunks 330nD or code chunks 330nC).

A codeword is a set of data chunks 330nD and code chunks 330nC based on those data chunks 330nD. If an MDS code is used to generate a codeword containing d data chunks 330nD and c code chunks 330nC, then all of the chunks 330 (data or code) can be reconstructed as long as any healthy chunks 330 (data or code) are available from the codeword.

Figure 3C:
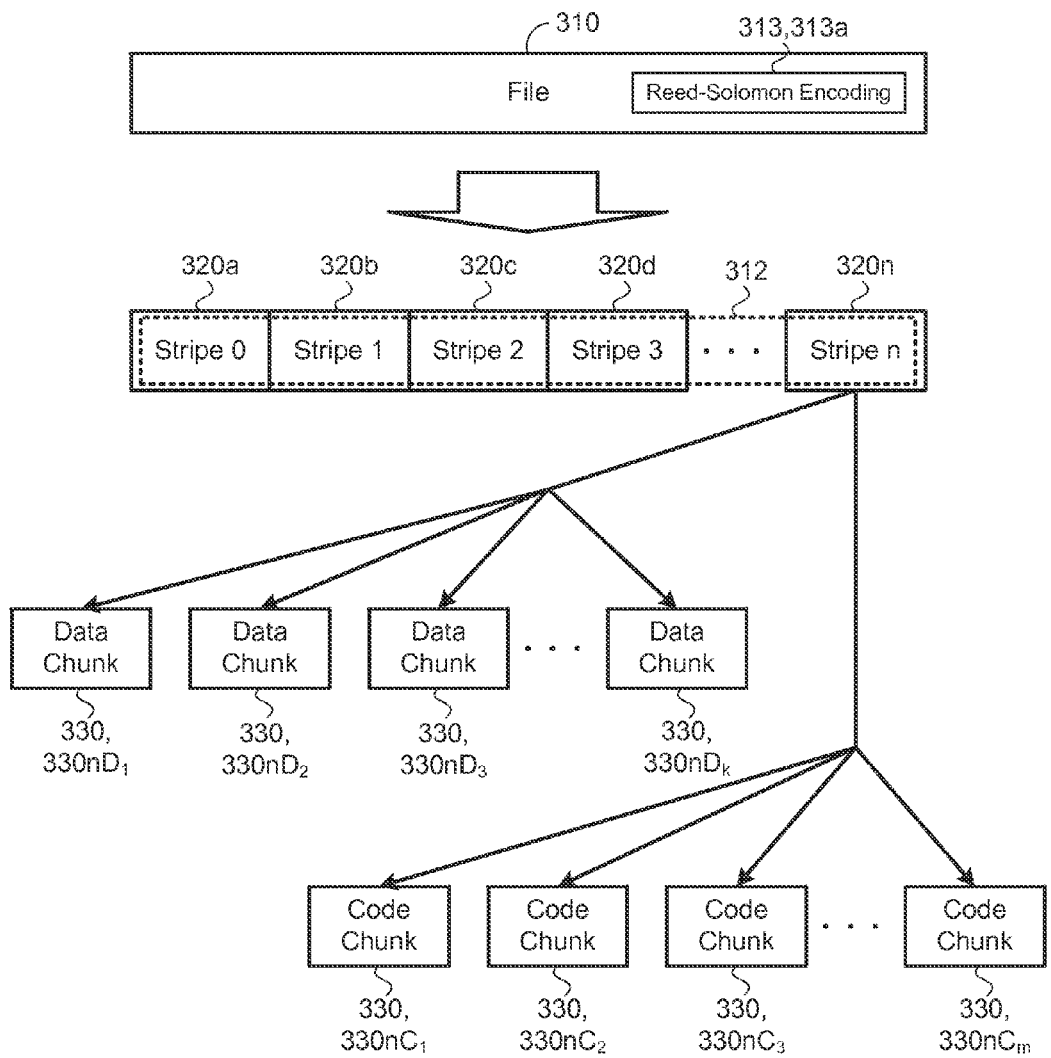
FIG. 3C is a schematic view of an exemplary Reed-Solomon coding technique.
Figure 3D:
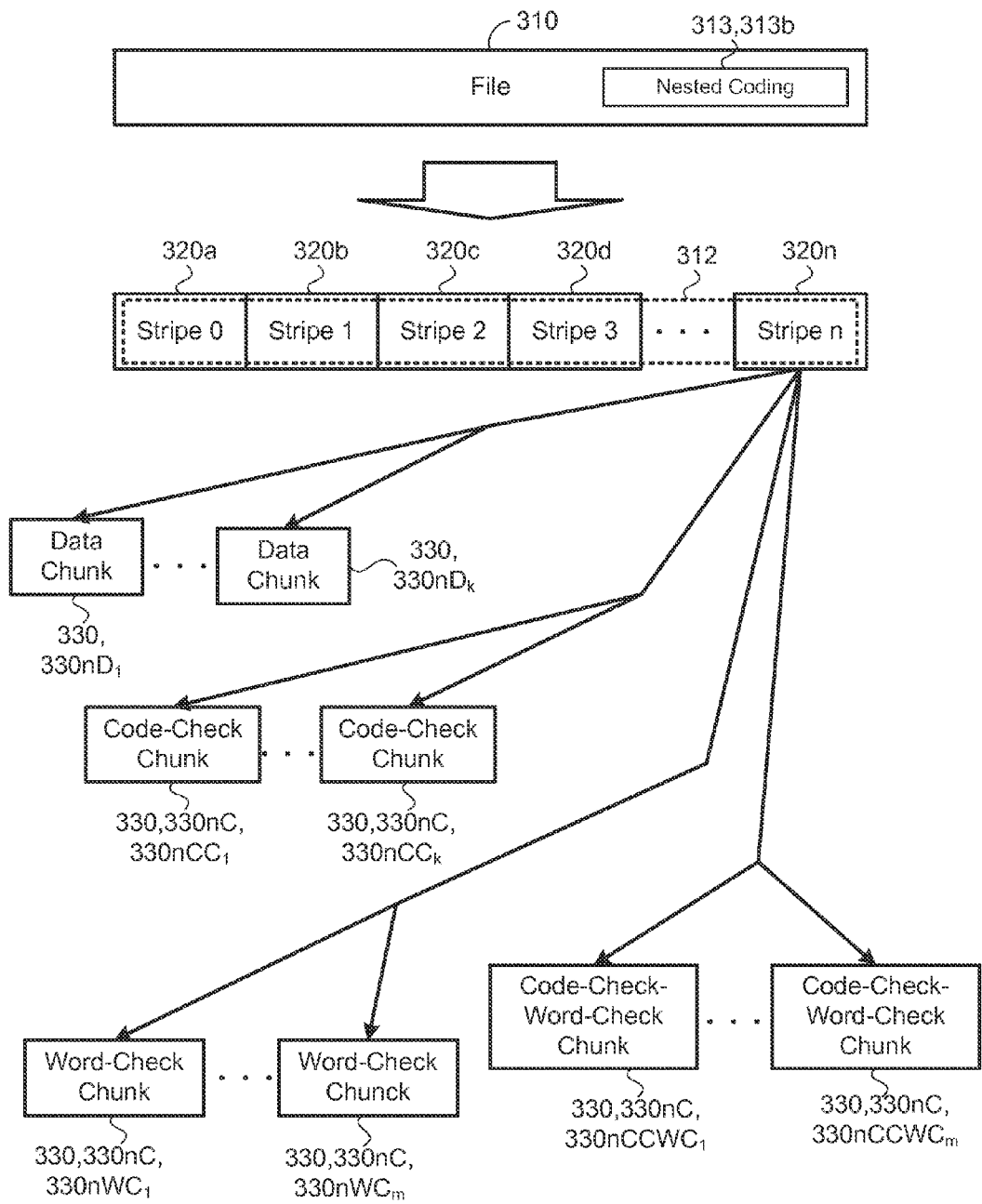
FIGS. 3D-3G are schematic views of exemplary nested coding techniques.

FIG. 3C shows a Reed-Solomon encoding 313a as the error-correcting code chunks 313. Each stripe 320 is divided into chunks 330 stored on multiple storage resources 114. The chunks 330 may be data chunks 330nD or code chunks 330nC, which together form a single code word. The data chunks 330nD include the actual data 312; while the code chunks 330nC are for parity to determine if the file 310 is intact. The Reed-Solomon encoding 313a allows for the loss of up to the total number of code chunks 330nC where the stripe 310 may still be reconstructed from the data chunk 330nD. Therefore, each stripe 320 of a file 310 consists of multiple data chunks 330nD and code chunks 330nC that the curator 210 places on multiple storage resources 114, where the collection of data chunks 330nD and code chunks 330nC forms a single code word. In general, the curator 210 may place each stripe 320 on storage resources 114 independently of how the other stripes 320 in the file 310 are placed on storage resources 114. The Reed-Solomon Encoding 313a adds redundant data 312, or parity data 312 to a file 310, so that the file 310 can later be recovered by a receiver even when a number of errors (up to the capability of the code being used) were introduced. Reed-Solomon Encoding 313a is used to maintain data integrity in resource hosts 110, to reconstruct data 312 for performance (latency), or to more quickly drain machines.

Referring to FIGS. 3D-3H, in nested coding 313b techniques, an encoded data block 316 includes a data block 316 having data chunks 330nD and error-correcting code chunks (i.e., non-data chunks 330nC) that is being stored is viewed as forming a two dimensional R×C array. There are X code chunks 330nC for each column C (called "code-check chunks 330nCC") that can be used to reconstruct X or fewer damaged chunks 330 per column. There are Y code chunks 330nC (called "word-check chunks 330nWC") for the entire 2-D array. When there are more than X damaged chunks 330 in one or more columns C, the word-check chunks 330nWC are used in addition to other healthy chunks 330 to reconstruct damaged chunks 330. Although some examples described in this specification illustrate encoded data blocks 314 (i.e., data block 316 and code chunks 330nC (i.e., non-data chunks 330nC)) as forming a two dimensional array, it is possible for coding techniques to create encoded data blocks 314 configured differently. For instance, different columns can have different numbers of code-check chunks 330nCC (i.e., the code-check chunk 330nCC), and columns C that contain word-check chunks 330nWC can have different numbers of rows than columns that contain data chunks 330nD and code-check chunks 330nC.

The codes 330nC can be used to store data 312 across resource hosts 110 by allocating each column C of data chunks 330nD to a data center. Each chunk 330 within the columns C can be allocated to a resource host 110 within a data center. Then, if X or fewer chunks 330 are lost at a data center, the chunks 330 can be reconstructed using only intra-data center communication (e.g., so no other data centers have to provide data 312 in performing reconstruction). If more than X chunks 330 are lost in one or more data centers, then the Y word-check chunks 330$n$WC are used to attempt reconstruction. Thus, inter-data center communication (which may be more expensive, e.g., slower than intra-data center communication) is only needed when more than X chunks 330 are damaged within a single data center.

The codes can also be used within a single data center. Instead of allocating different columns C to different data centers, the encoding system 102 stores all of the columns at a single data center. The data chunks 330$n$D and code chunks 330$n$C can be stored at distinct resource hosts 110 within that data center. This is useful, for example, where reading data 312 from resource hosts 110 during reconstruction is expensive (e.g., time consuming), so that the encoding system 102 can read fewer chunks 330 during reconstruction than would be needed using conventional coding techniques. Small numbers of damaged chunks 330 can be reconstructed by reading small numbers of other chunks 330 (code-check chunks 330$n$CC and other data chunks 330$n$D in the column C), and large numbers of damaged chunks 330 can be reconstructed using the word-check chunks 330$n$WC when needed.

Referring to FIGS. 3D-3H, in some implementations, a nested coding 313$b$ technique shows data chunks 330$n$D and code chunks 330$n$C that form a codeword. As shown, the nested coding 313$b$ technique is a two dimensional (2D) nested coding 313$b$ technique, but a three dimensional (3D) nested coding 313$b$ technique may also be applied. A 2D nested code 313$b$ is created from an arbitrary linear MDS code in systematic form. Word-check chunks 330$n$WC that are based on a data block 316 are partitioned into two groups, the first group including X code chunks 330$n$C and the second group including N code chunks 330$n$C. The block of data 312 is viewed as forming an array of columns C, and X code chunks 330$n$C in the first group are used to create X column chunks 330 per column by "splitting" them into separate components per column ("split" code-check chunks 330$n$CC). The N code chunks 330$n$C in the second group form word-check chunks 330$n$WC.

Figure 3E:
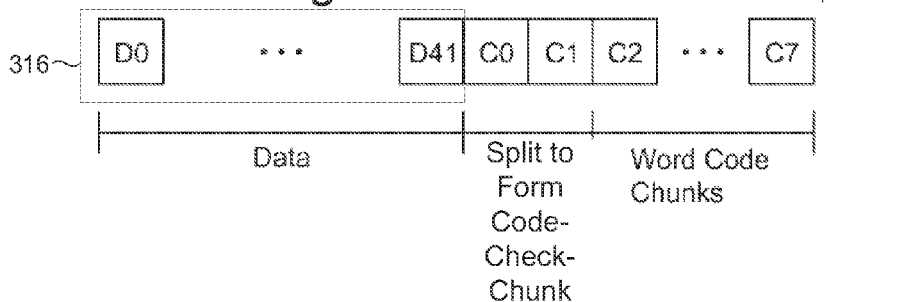

For example, FIG. 3E shows data block (D0-D41) 316 where D0-D41 are data chunks 330$n$D and code chunks (C0-C7) 330$n$C that are based on the data block (D0-D41) 316. The data chunks (D0-D41) 330$n$D and the code chunks (C0-C7) 330$n$C form a codeword. The code chunks 330$n$C are partitioned into a first group that includes C0-C1 and a second group that includes C2-C7. C0-C1 are split to form split code-check chunks 330$n$CC. C2-C7 are used as word-check chunks 330$n$WC.

Figure 3F:
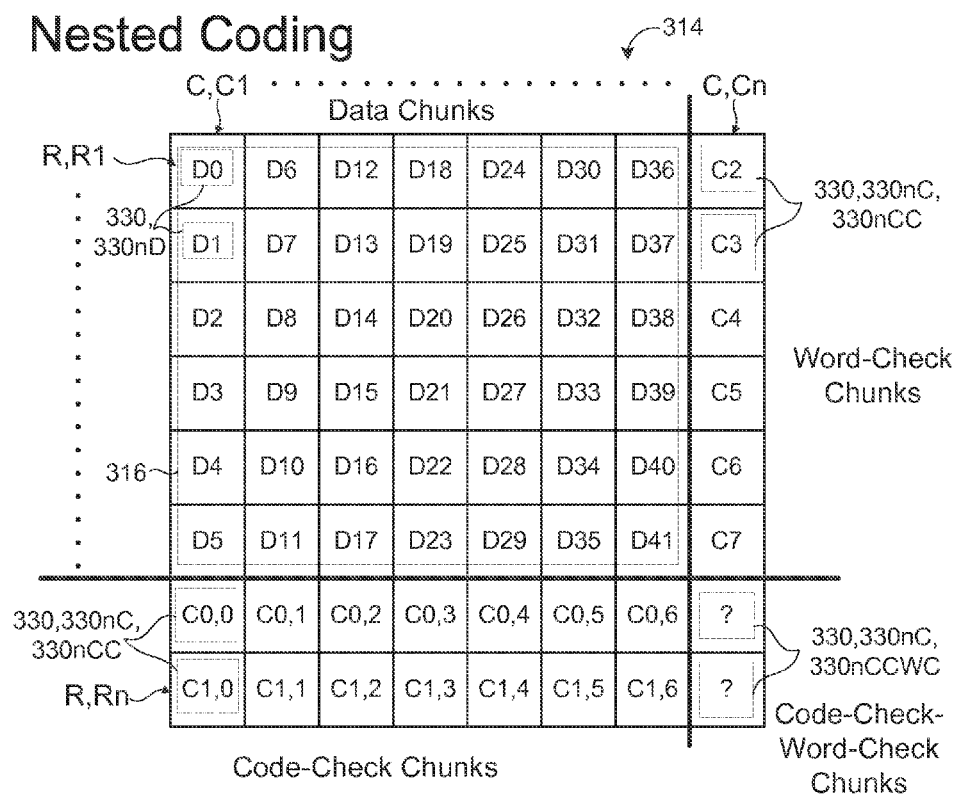

Referring to FIG. 3F, a resulting encoded data block 314 that includes the data block (D0-D41) 316 and additional code chunks 330$n$C (split code-check chunks 330$n$CC and word-check chunks 330$n$WC) is shown. To generate a split code-check chunk 330$n$CC corresponding to C0 for column j (denoted C0,j), C0 is generated as though all the data chunks 330$n$D not in column j have the value zero. That is, C0,j has the value that would result from performing the operations to generate C0 using the full data block 316 of data chunks 330$n$D but instead using only the column j, with all of the other columns zeroed out. For example, if a generator matrix would be used to generate C0 for the full data block 316, then the generator matrix can be modified to generate C0,j so that it has the value that would result from using the original generator matrix and applying that original generator matrix to the data block 316 with data chunks 330$n$D in columns other than column j zeroed out.

The split code-check chunks 330$n$CC for C1,j for each column C are generated similarly, but using C1 instead of C0. As a result, C0 is a linear combination of C0,0-C0,6 and C1 is a linear Combination of C1,0-C1,6. That is, $$C0 = \Sigma_{j=0}^{6} C0,j; \quad (1)$$

and $$C1 = \Sigma_{j=0}^{6} C1,j. \quad (2)$$

The chunks 330 denoted as "?" in FIG. 3F can be generated in various ways, e.g., as described further below with reference to FIG. 3G.

In the example of FIGS. 3E and 3F, the resulting encoded data block 316 includes 42 data chunks 330$n$D and 8 code chunks 330$n$C. Referring to the original code used to create the encoded block 314, the code chunks 330$n$C belong to one of two groups as described above, X=2 of which are in the first group and N=6 of which are in the second group. Whenever there are two or fewer (X or fewer) damaged chunks 330 within one of the first seven columns, the damaged chunks 330 can be corrected using the healthy chunks 330 of the columns C and the split code-check chunks 330$n$CC for the column C. To see this, let j denote the column C including the two or fewer damaged chunks 330 and consider the codeword obtained by zeroing-out all the data chunks 330$n$D from columns C other than j. In that codeword, C0=C0,j and C1=C1,j. As a result, the two or fewer damaged chunks 330 in other columns as containing all-zero data chunks 330$n$D, and by viewing the word-check chunks 330$n$WC as being damaged.

In the example shown in FIG. 3F, the word-check chunks 330$n$WC fully fill an entire column C (the column to the right). 2D nested codes 313$b$ can be created with an arbitrary number of columns C of word-check chunks 330$n$WC. The columns C of word-check chunks 330$n$WC can have the same number of rows R as the columns of data chunks 330$n$D or different numbers of rows R, and the columns C of word-check chunks 330$n$WC can have different numbers of rows R from each other. Columns C of word-check chunks 330$n$WC can, but do not have to, have code-check chunks 330$n$CC, i.e., code-check-word-check chunks 330$n$CCWC. Increasing the number of word-check chunks 330$n$WC improves the reliability of the stored data 312 but uses more storage at resource hosts 110. In general, for nested codes 313$b$, columns C include either data chunks 330$n$D or word-check chunks 330$n$WC and not both.

In general, a 2D nested code 313$b$ with X split code-check chunks 330$n$CC per column C and N word-check chunks 330$n$WC can be used to reconstruct X damaged chunks 330 per column C (in those columns that include data chunks 330$n$D) while performing only intra-columns communication (which is typically, e.g., intra-data center communication). In reconstructing multiple damaged chunks 330 within the block, those damaged chunks 330 are typically reconstructed first because intra-column communication is less expensive than inter-column communication, but other damaged chunks 330 may remain. If, after reconstructing damaged chunks 330 within columns, (N+X) or fewer other chunks 330 are still damaged (because they were not able to be reconstructed using intra-column communication), those other damaged chunks 330 can be reconstructed using the word-check chunks 330$n$WC and the split code-check chunks 330$n$CC. The word-check chunks 330$n$WC in the first group (C0 and C1) can be determined from the split code-check chunks 330$n$CC, e.g., using the formula Ci=$\Sigma_{j=0}^{6}$C i, j, even though those word-check chunks 330$n$WC are not explicitly stored.

To see this, let Z denote the number of word-check chunks 330nWC that are damaged and let Y denote the number of word-check chunks 330nWC in the first group that cannot be reconstructed from their corresponding split code-check chunks 330nCC according to the formula $Ci=\Sigma_{j=0}^{6} C0,j$ to split code-check chunks 330nCC being damaged. Using that formula, X–Y word-check chunks 330nWC from the first group can be determined, resulting in a codeword (e.g., the one shown in FIG. 3E) with Y damaged word-check chunks 330nWC in the first group and Z damaged word-check chunks 330nWC in the second group. Because there are at most N+X total damaged chunks 330, there are at most N+X–Y–Z damaged data chunks 330nD. Thus, it is possible to use the resulting codeword to reconstruct all of the damaged chunks 330, as it includes at most N+X–Y–Z+Y+Z=N+X damaged chunks 330.

Figure 3G:
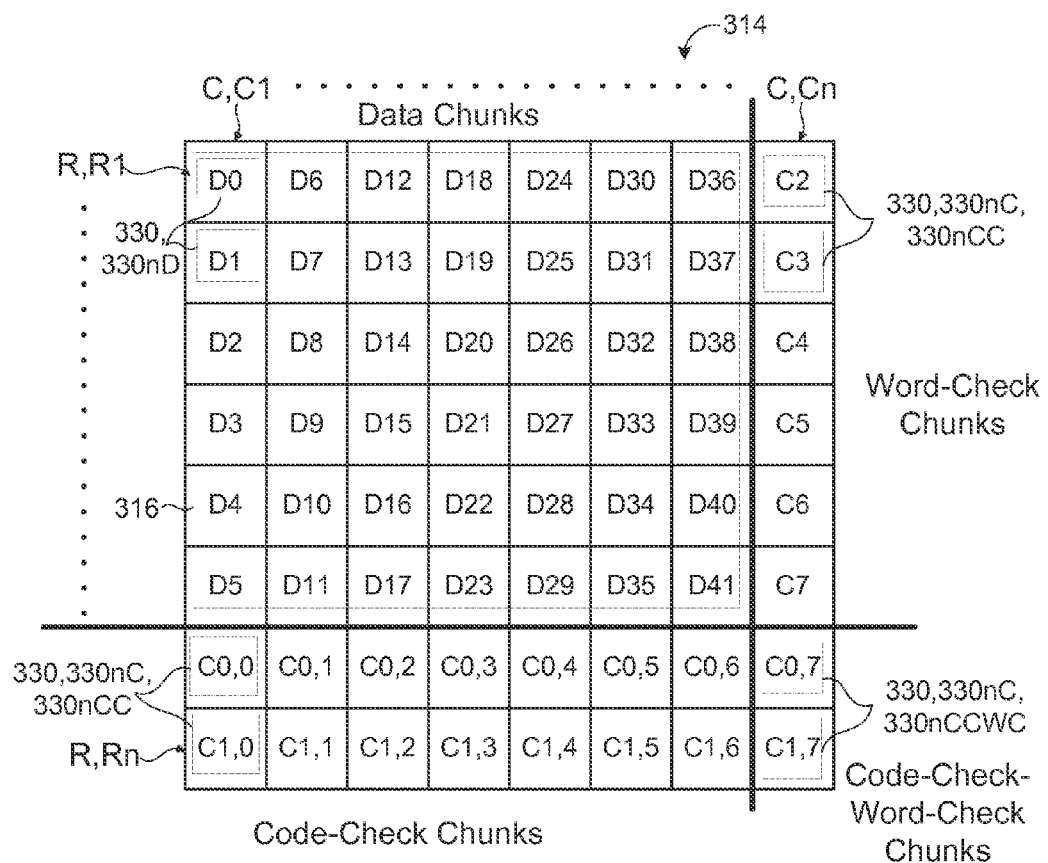

Referring to FIG. 3G, in some implementations, the resulting encoded block 314 includes code-check chunks 330nCC for the word-check chunks 330nWC (i.e., code-check-word-check chunks 330nCCWC). Compared to the encoded block 314 of FIG. 3F, the block of FIG. 3G includes the code-check chunks C0,7 and C1,7 330nCC in place of the locations marked with "?" in FIG. 3F. This is one way to provide for reconstructing damaged word-check chunks 330nWC without relying on inter-column communication. The code-check chunks C0,7 and C1,7 330nCC can be generated in various ways. For example, those code-check chunks 330nCC can be generated based on C2-C7 in the same manner that C0,0 and C1,0 are generated based on D0-D5. The resulting encoded block of FIG. 3G (using the example nested code 313b) can be used to reconstruct up to eight damaged chunks 330 after performing intra-column reconstruction. Code-check chunks 330nC can be added for any number of columns that include word-check chunks 330nWC.

Figure 3H:
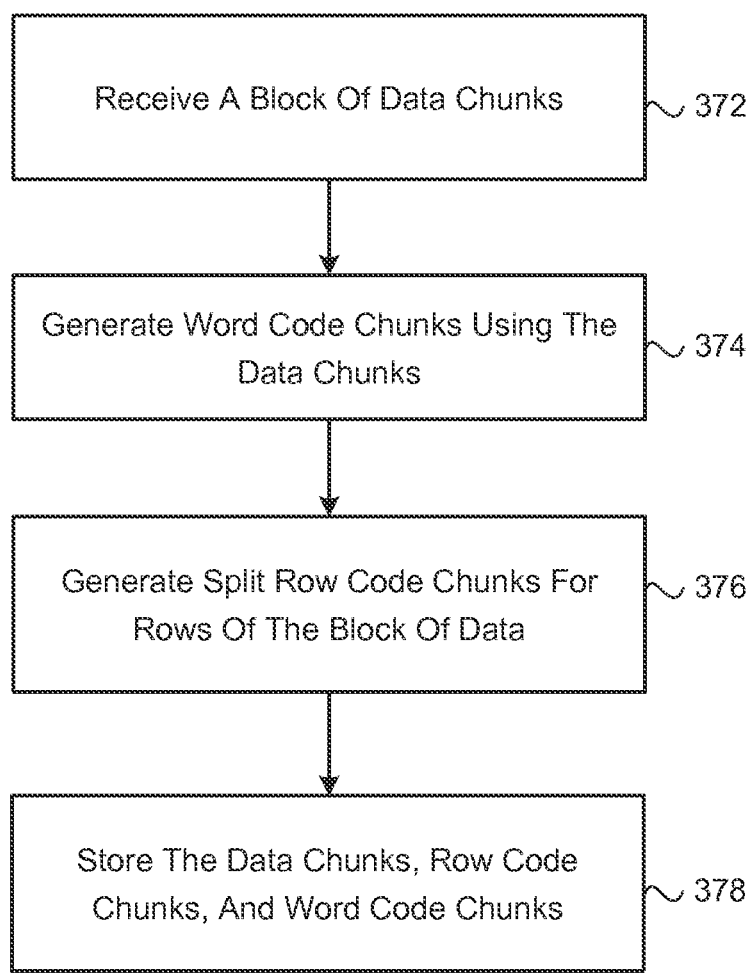
FIG. 3H is an exemplary arrangement of operations for storing data using nested coding techniques.

Referring to FIG. 3H, in some implementations, the curator 210 distributes data 312 using a nested code 313b. The system 100 receives a data block 316 (step 372). The data block 316 can include $m_d*n_d$ data chunks 330nC, and is a number of data rows and $n_d$ is a number of data columns, and $m_d$ and $n_d$ are greater than or equal to one. The encoded block 314 includes m*n chunks 330 that include $m_d*n_d$, where in is the total number of rows R of data chunks 330nD and non-data chunks 330nC, and n is the number of columns C of data chunks 330nD and non-data chunks 330nC; m and n are greater than or equal to one. The system 100 generates one or more columns C of word-check chunks 330nWC using a first linear error-correcting code 313 in systematic form and the data chunks 330nD (step 374). The word-check chunks 330nWC and the data chunks 330nD of the same row R form a codeword. For each of $m_d$ row of data chunks 330nC, the system 100 generates one or more split code-check chunks 330nCC for the Column C (step 376). The split code-check chunks 330nCC are generated so that a linear combination of n split code-check chunks 330nCC from different columns C forms a first word-check chunk 330nWC of a first codeword including the data chunks 330nD and the m word-check chunks 330nWC. The first word-check chunk 330nWC (and any other word-check chunks 330nWC resulting from a linear combination of split code-check chunks 330nCC from different columns C) forms a codeword with the data chunks 330nD and the word-check chunks 330nWC generated in step 374. For example, the split code-check chunks 330nCC for each columns C can be generated using a splitting error-correcting code 313 and the $m_d$ data chunks 330nD or the word-check chunks 330nWC, wherein the splitting error-correcting code 313 includes a splitting generator matrix that codes the same as a generator matrix for the first linear error-correcting code 313 applied to the data chunks 330nD with the data chunks 330nD zeroed-out for columns C other than the column C.

The system 100 stores the column C of data chunks 330nD and the split code-check chunks 330nCC and the word-check chunks 330nWC (step 378). In some implementations, the system 100 stores all the chunks 330 at a single group of resource hosts 110. In some other implementations, the system 100 allocates each column C to a distinct group of resource hosts 110. When the system 100 identifies one or more damaged chunks 330, the system 100 can reconstruct the damaged chunks 330 using the split code-check chunks 330nCC and the word-check chunks 330nWC. Typically, the system 100 attempts to reconstruct damaged chunks 330 using the split code-check chunks 330nCC and other data chunks in the same column C. If, after reconstructing damaged chunks 330 using only the split code-check chunks 330nCC, some damaged chunks 330 remain, the system 100 uses the word-check chunks 330nWC for reconstruction, including the word-check chunks 330nWC that can be determined by determining a linear combination of the split code-check chunks 330nCC. In some examples, when there are multiple losses, the system 100 uses any of the chunks 330 including data chunks 330nD.

The storage system 100 or portions thereof may undergo a system failure for a period of time. The data 312 distributed on the resource hosts 110 of the storage system 100 may not be available for users. For example, referring back to FIG. 1B, a resource host 110a may be undergoing maintenance or has a system failure; therefore, data 312 (e.g., stripe replicas 330n, data chunks 330nD and non-data chunks 330nC) stored on the resource host 110a may not be retrievable (i.e., the data 312 is inaccessible). In addition, the resource host 110a may take an extended period of time (e.g., a week) to be functional or for maintenance to be completed. Within the period during which the resource host 110a is not available, the storage system 100 recovers the lost data 312 so that the data 312 is available if a user makes a file request 122.

In some implementations, the system 100 segments the data 312 into high-availability data 312 and low-availability data 312 and determines which data 312 is more at risk of loss due to the maintenance. The system 100 may recover or replicate the high-availability data 312 without recovering all or most of the remaining data 312. Since some of the data 312 may be available shortly after a maintenance or failure, the system 100 delays recovering that data 312 and replaces the high-availability data 312 instead.

Figure 4A:
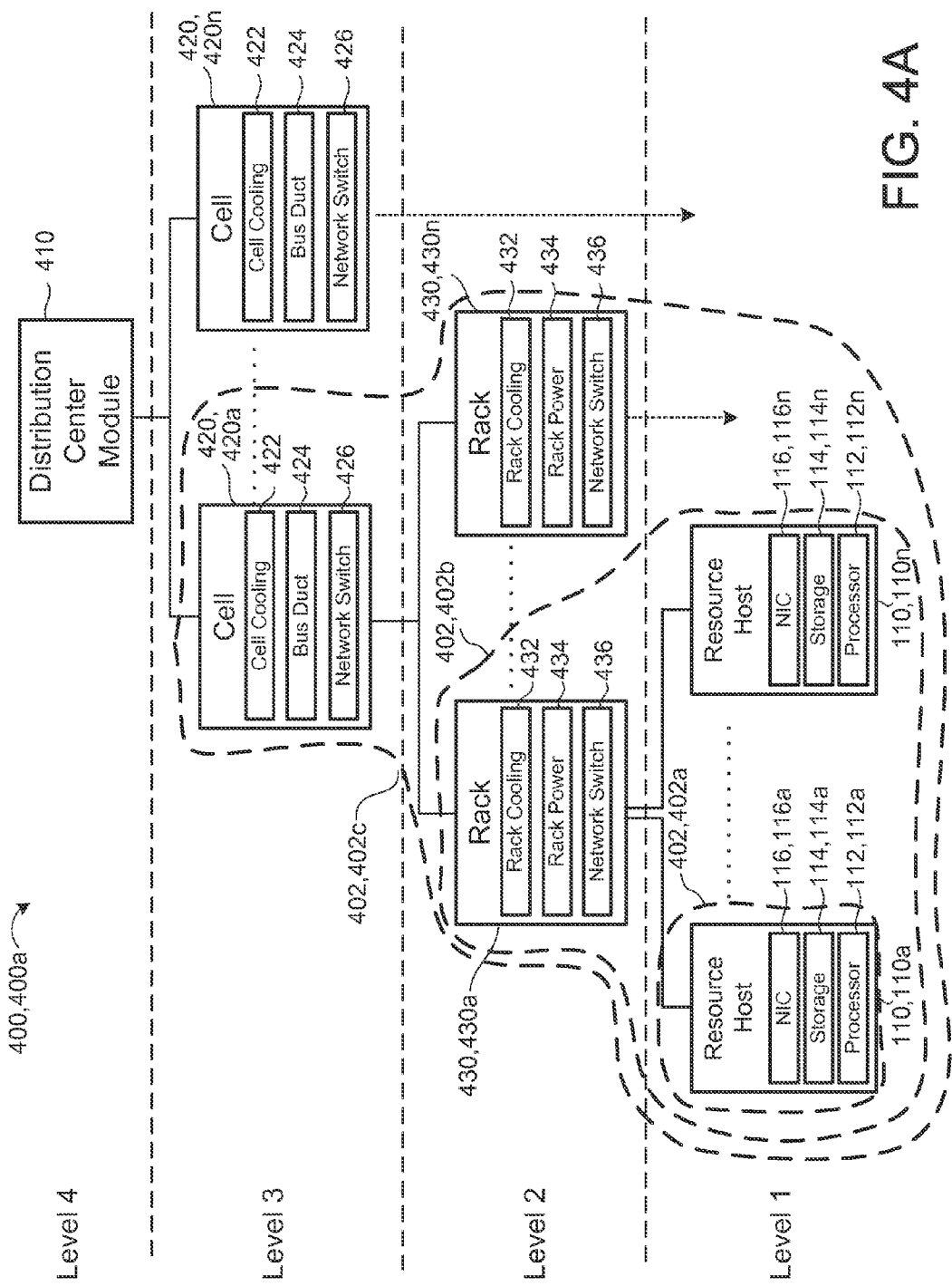
Figure 4B:
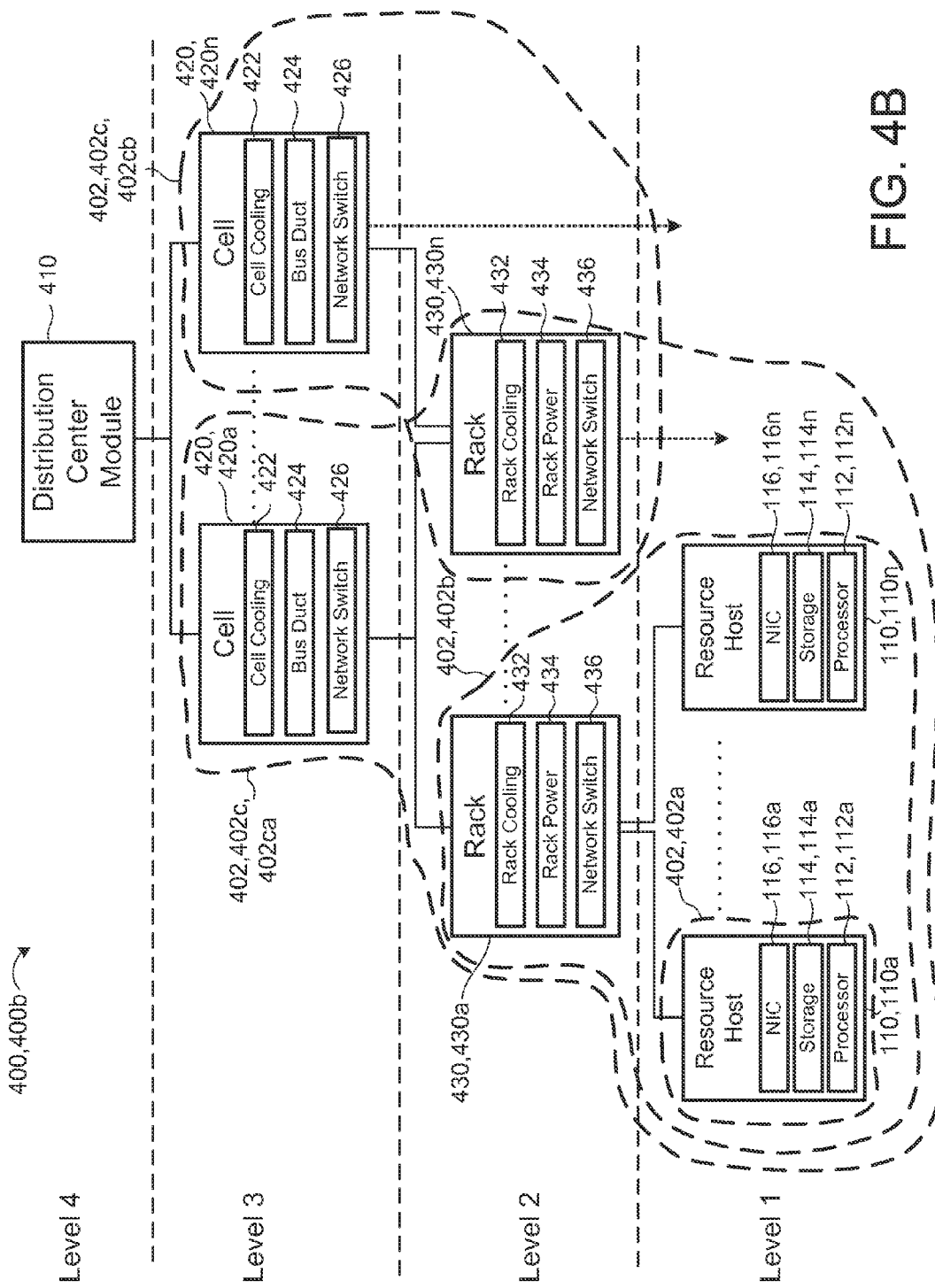

Referring to FIGS. 4A-4C, the curator 210 may determine or receive a system hierarchy 400 of the distributed storage system 100 to identify the levels (e.g., levels 1-4) at which maintenance may occur without affecting a user's access to stored data 312. Maintenance or failures (strict hierarchy 400a (FIG. 4A), non-strict hierarchy 400b (FIG. 4B)) may include power maintenance/failures, cooling system maintenance/failures (FIG. 4C), networking maintenance/failures, updating or replacing parts, or other maintenance or power outage affecting the distributed storage system 100. Maintenance may be scheduled and in some examples, an unscheduled system failure may occur.

The system hierarchy 400 includes system levels (e.g., levels 1-4) with maintenance units/system domains 402 spanning one or more system levels 1-5. Each system domain 402 has an active state or an inactive state. A distribution center module 410 includes one or more cells 420, 420a-n, and each cell 420 includes one or more racks 430 of resource hosts 110. Each cell 420 also includes cell cooling 422, cell power 424 (e.g., bus ducts), and cell level networking 426 (e.g., network switch(es)). Similarly, each rack 430 includes rack cooling 432, rack power 434 (e.g., bus ducts), and rack level networking 436 (e.g., network switch(es)).

The system levels may include first, second, third, and fourth system levels 1-4. The first system level 1 corresponds to resource hosts or host machines 110, 110a-n of data processing devices 112, non-transitory memory devices 114, or network devices 116 (e.g., NICs). Each host machine/resource host 110 has a system domain 402. The second system level 2 corresponds to racks 430, 430a-n and cooling deliverers 432, power deliverers 434 (e.g., bus ducts), or communication deliverers 436 (e.g., network switches and cables) of the host machines 110 at the rack level. Each rack 430 or rack level-cooling deliverer 432, -power deliverer 434, or -communication deliverer 436 has a system domain 402. The third system level 3 corresponds to any cells 420, 420a-n of the distribution center module 410 and the cell cooling 422, cell power 424, or cell level networking 426 supplied to the associated racks 430. Each cell 420 or cell cooling 422, cell power 424, or cell level networking 426 has a system domain 402. The fourth system level 4 corresponds to the distribution center module 410. Each distribution center 410 module has a system domain 402.

FIG. 4A shows a strict system hierarchy 400a where each hierarchy component (e.g., a resource host 110, a rack 430, a cell 420, or a distribution center module 410) of the system hierarchy 400 depends on one other hierarchy component 110, 410, 420, 430. While FIG. 4B shows a non-strict system hierarchy 400b, where one hierarchy component 110, 410, 420, 430 has more than one input feed. In some examples, the curator 210 stores the system hierarchy 400 on the non-transitory memory 204 of its processor 202. For example, the curator 210 maps a first resource host 110 (and its corresponding processor resource 112a and storage resource 114a) to a first rack 430a, the first rack 430a to a first bus duct 420a, and the first bus duct 420a to a first distribution center module 410a.

The curator 210 determines, based on the mappings of the hierarchy components 110, 410, 420, 430, which resource hosts 110 are inactive when a hierarchy component 110, 410, 420, 430 is undergoing maintenance. Once the curator 210 maps the system domains 402 to the resource hosts 110 (and therefore to their corresponding processor resources 112a and storage resources 114a), the curator 210 determines a highest level (e.g., levels 1-4) at which maintenance can be performed while maintaining processor or data availability.

A system domain 402 includes a hierarchy component 110, 410, 420, 430 undergoing maintenance and any hierarchy components 110, 410, 420, 430 depending therefrom. Therefore, when one hierarchy component 110, 410, 420, 430 undergoes maintenance that hierarchy component 110, 410, 420, 430 is inactive and any other hierarchy components 110, 410, 420, 430 in the system domain 402 of the hierarchy component 110, 410, 420, 430 are also inactive. For example, when a resource host 110 is undergoes maintenance, a level 1 system domain 402a, which includes the storage device 114, the data processor 112, and the NIC 116, is in the inactive state. When a rack 430 undergoes maintenance, a level 2 system domain 402b, which includes the rack 430 and any resource hosts 110 depending from the rack 430, is in the inactive state. When a cell 420 (for example, to any one of the cell cooling component 422, the bust duct 424, and/or the network switch 426 of the cell 420a) undergoes maintenance, a level 3 system domain 402c, which includes the cell 420 and any hierarchy components 110, 410, 420, 430 in levels 3 and 4 that depend from the cell 420, is in the inactive state. Finally, when a distribution center module 410 undergoes maintenance, a level 4 system domain 402, 402d, which includes the distribution center module 410a and any hierarchy components 110, 410, 420, 430 in levels 2 to 4 depending from the distribution center module 410, is in the inactive state.

In some examples, as shown in FIG. 4B, a non-strict hierarchy component 410, 420, 430, 114 may have dual feeds, i.e., the hierarchy component 110, 410, 420, 430 depends on two or more other hierarchy components 110, 410, 420, 430. For example, a cell 420 may have a feed from two distribution center modules 410; and/or a rack 430 may have a dual feed from two cells 420. As shown, a level 2 system domain 402b may include two racks 430a, 430n, where the second rack 430n includes two feeds from two cells 420a, 420n. Therefore, the second rack 430n is part of two system domains 402ca and 402cb. Therefore, the lower levels of the system hierarchy 400 are maintained without causing the loss of the higher levels of the system hierarchy 400. This causes a redundancy in the system 100, which allows for data accessibility. In particular, the distribution center module 410 may be maintained without losing any of the cells 420 depending from it. In some examples, the racks 430 include a dual-powered rack that allows the maintenance of the bus duct 424 without losing power to the dual-powered racks 430 depending from it. In some examples, system domains 402 that may be maintained without causing outages are ignored when distributing chunks 330 to allow for maintenance; however, the ignored system domains 402 may be included when distributing the chunks 330 since an unplanned outage may still cause the loss of chunks 330.

In some examples, a cooling device, such as the cell cooling 422 and the rack cooling 432, are used to cool the cells 420 and the racks 430, respectively. The cell cooling component 422 may cool one or multiple cells 420. Similarly, a rack cooling component 432 may cool one or more racks 430. The curator 210 stores the association of the resource hosts 110 with the cooling devices (i.e., the cell cooling 422 and the rack cooling 432). In some implementations, the curator 210 considers all possible combinations of maintenance that might occur within the storage system 100 to determine a system hierarchy 400 or a combination of maintenance hierarchies 400. For example, a system hierarchy 400 where one or more cooling devices 422, 432 fail, or a system hierarchy 400 where the network devices 116, 426, 436 fail, or a system hierarchy 400 where the power distribution 424, 434 fails.

Therefore, when a hierarchy component 110, 410, 420, 430 in the storage system 100 undergoes maintenance that hierarchy component 110, 410, 420, 430 and any hierarchy components 110, 410, 420, 430 that are mapped to or depending from that hierarchy component 110, 410, 420, 430 are in an inactive state. A hierarchy component 110, 410, 420, 430 in an inactive state is inaccessible by a user 120, while a hierarchy component 110, 410, 420, 430 in an active state is accessible by a user 120, allowing the user 120 to process/access data 312 stored/supported/maintained by that hierarchy component 110, 410, 420, 430. As previously mentioned, during the inactive state, a user 120 is incapable of accessing the resource host 110 associated with the system domains 402 undergoing maintenance; and therefore, the client 120 is incapable of accessing the files 310 (i.e., chunks 330, which include stripe replicas 330n, data chunks 330nD and non-data chunks 330nC).

In some implementations, the curator 210 restricts a number of chunks 330 distributed to storage devices 114 of any one system domain 402, e.g., based on the mapping of the hierarchy components 110, 410, 420, 430. Therefore, if a level 1 system domain 402 is inactive, the curator 210 maintains accessibility to the file 310 (or stripe 320) although some chunks 330 may be inaccessible. In some examples, for each file 310 (or stripe 320), the curator 210 determines a maximum number of chunks 330 that may be placed within any storage device 114 within a single system domain 402, so that if a system domain 402 associated with the storage device 114 storing chunks 330 for a file 310 is undergoing maintenance, the curator 210 may still retrieve the file 310. The maximum number of chunks 330 ensures that the curator 210 is capable of reconstructing the file 310 although some chunks 330 may be unavailable. In some examples, the maximum number of chunks 330 is set to a lower threshold to accommodate for any system failures, while still being capable of reconstructing the file 310 from the chunks 330. When the curator 210 places chunks 330 on the storage devices 114, the curator 210 ensures that within a stripe 320, no more than the maximum number of chunks 330 are inactive when a single system domain 402 undergoes maintenance. Moreover, the curator 210 may also restrict the number of processing jobs on a data processor 112 of a resource host 110 within a system domain 402, e.g., based on the mapping of the hierarchy components 110, 410, 420, 430. Therefore, if a level 1 system domain 402 is inactive, the curator 210 maintains accessibility to the jobs although some of the processors 112 of the resource hosts 110 are inactive.

In some implementations, and as previously discussed, the system 100 may undergo maintenance or unplanned failures. Some data 312 stored on the storage devices 114 may have a higher risk of becoming fully unavailable when the storage device 114 it is stored on is in an inactive state. The curator 210 may segment the data 312 so that data 312 that has a greater risk of loss due to the maintenance event may be recovered or replicated without the curator 210 having to replicate or recover the rest of the data 312 (that does not have a greater risk of loss).

In some implementations, the curator 210 identifies chunks 330 as high-availability chunks 33a0 or low-availability chunks 330b. The high-availability chunks 330a have a higher priority and take precedent over the low-availability chunks 330b. In some examples, the curator 210 determines the availability of the chunks 330 based on the data 312 or based on the owner or user of the data 312.

The curator 210 may determine an effective redundancy value for each stripe 320 of a file 310 to determine if the system 100 should prioritize the stripe 320 for recovery (i.e., adding replicas 330n or storing reconstructed chunks/portions of the file 310 to improve durability and availability of the file 310). The effective redundancy value is based on the chunks 330 and any system domains 402 that are associated with the corresponding stripe 320. In some implementations, the effective redundancy is based on the number of system domains 402 that can be lost so that the data 312 in the stripe 320 becomes unavailable or inaccessible (e.g., un-reconstructable). Alternatively, the effective redundancy is the number of chunks 330 in a stripe 320 that need to be lost so that the data 312 in the stripe 320 becomes unavailable or inaccessible (e.g., un-reconstructable). This may apply when all of the chunks 330 of a stripe 320 are on different memory devices 114 and the curator 210 determines the effective redundancy value at the disk level, system level 1. If the number of lost system domains 402 (or alternatively, lost chunks 330) is equal or greater to the effective redundancy, the system 100 would not be able to reconstruct the stripe 320 (i.e., the system 100 is not able to read the data of the stripe 312). For example, an effective redundancy equaling one indicates that there is at least one chunk 330 in a stripe 320 such that, if it becomes unavailable, the system 100 would not be able to read the data 312 of the stripe 320. An effective redundancy equaling two indicates that a minimum number of two chunks 330 are needed to become unavailable for the system 100 not to be able to read the data of the stripe 320.

In some implementations, the curator 210 determines the effective redundancy value at various system hierarchy levels (e.g., levels 1-4). The curator 210 considers a specific stripe 320 and the level at which it may determine the effective redundancy value. The curator 210 simulates removing chunks 330 from the stripe 320 to determine the effective redundancy value. The curator 210 hypothetically removes chunks 330 from the stripe 320 by removing those chunks 330 for which the largest number of chunks 330 depend on a single node in the selected level of the system hierarchy 400. The curator 210 keeps hypothetically removing chunks 330 until a number of remaining chunks 330 is incapable of reconstructing the data 312 within the specific stripe 320. The number of rounds of removal is the effective redundancy.

For replicated encodings (discussed in FIG. 3A), the effective redundancy value is the number of unique system domains 402 at the selected level of the system hierarchy 400 that contain at least one healthy (e.g., accessible) chunk 300, because as long as the system 100 retains one chunk 330 (e.g., replicated chunks 330n) in a system domain 402 then the data 312 is redundant. For example, if the stripe 320 has one or more replica chunks 330n in a single system domain 402, then the effective redundancy equals 1. If the stripe 320 has at least one available/accessible chunk 330 in one system domain 402 and another available/accessible chunk 330 in another system domain 402, then the effective redundancy equals 2. Referring to the example shown in FIG. 4C, consider a stripe 320 having three replica chunks 330n stored on a first storage device 114a, a second storage device 114b, and a third storage device 114c. Each storage device 114a-c is located on a different rack 430. The first storage device 114a is located on a first rack 430a, the second storage device 114b is located on a second rack 430b, and the third storage device 114c is located on a third rack 430c. As shown, the first and second racks 430a, 430b share the same first cell 420a (e.g., bus duct 424), and the third rack 430c depends on a second cell 420b. Thus, the replica chunks 330n are located in two level 3 system domains 402ca, 402cb. The replica chunks 330n are also located in three level 2 system domains 402ba, 402bb, 402bc and three level 4 system domains 402aa, 402ab, 402ac. In addition, the first cell 420a and the second cell 420b both depend on one distribution center module 410, 410a. The effective redundancy of the stripe 320 at the level of the storage devices 114 (at level 1) equals 3, since replica chunks 330n are placed on three different storage devices 114. The effective redundancy of the stripe 320 at the level of the racks 430 (level 2) equals 3 as well, since the replica chunks 330n are placed on storage devices 114 depending from three different racks 430a-c. The effective redundancy of the stripe 320 at the level of the cells 420 (level 3) is 2, since the data 312 is placed on storage devices 114 depending from two busducts 424 feeding the first and second cells 420a, 420b. The effective redundancy of the stripe 320 at the level of the distribution center module 410 (level 4) is 1. Therefore, the effective redundancy value may be considered as the number of unique system domains 402 at the selected level of the system hierarchy 400 that contain at least one healthy (e.g., accessible) chunk 300 (because as long as the system 100 retains one chunk 330, the data 312 is redundant for the replication).

Figure 4D:
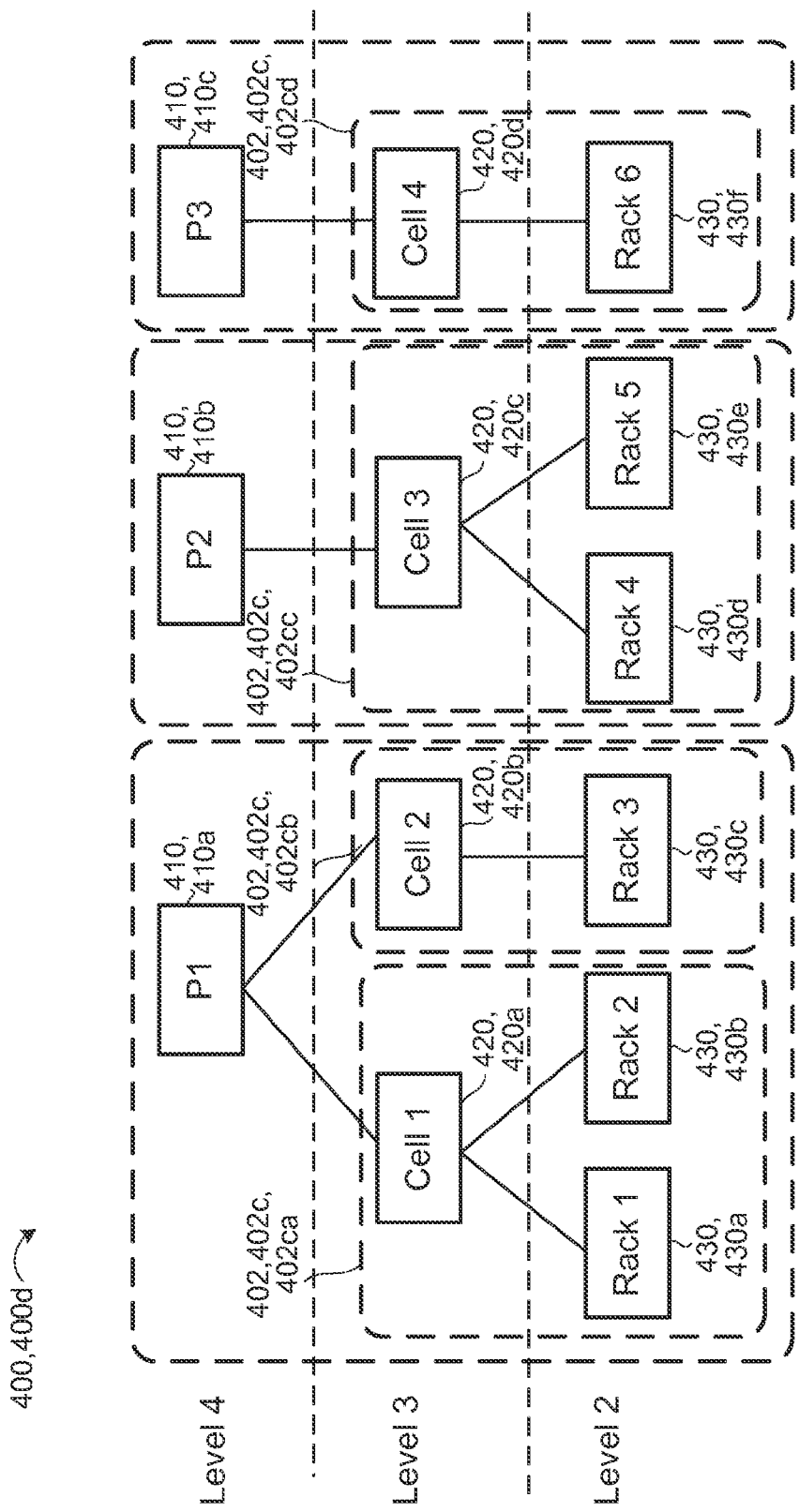
Figure 4E:
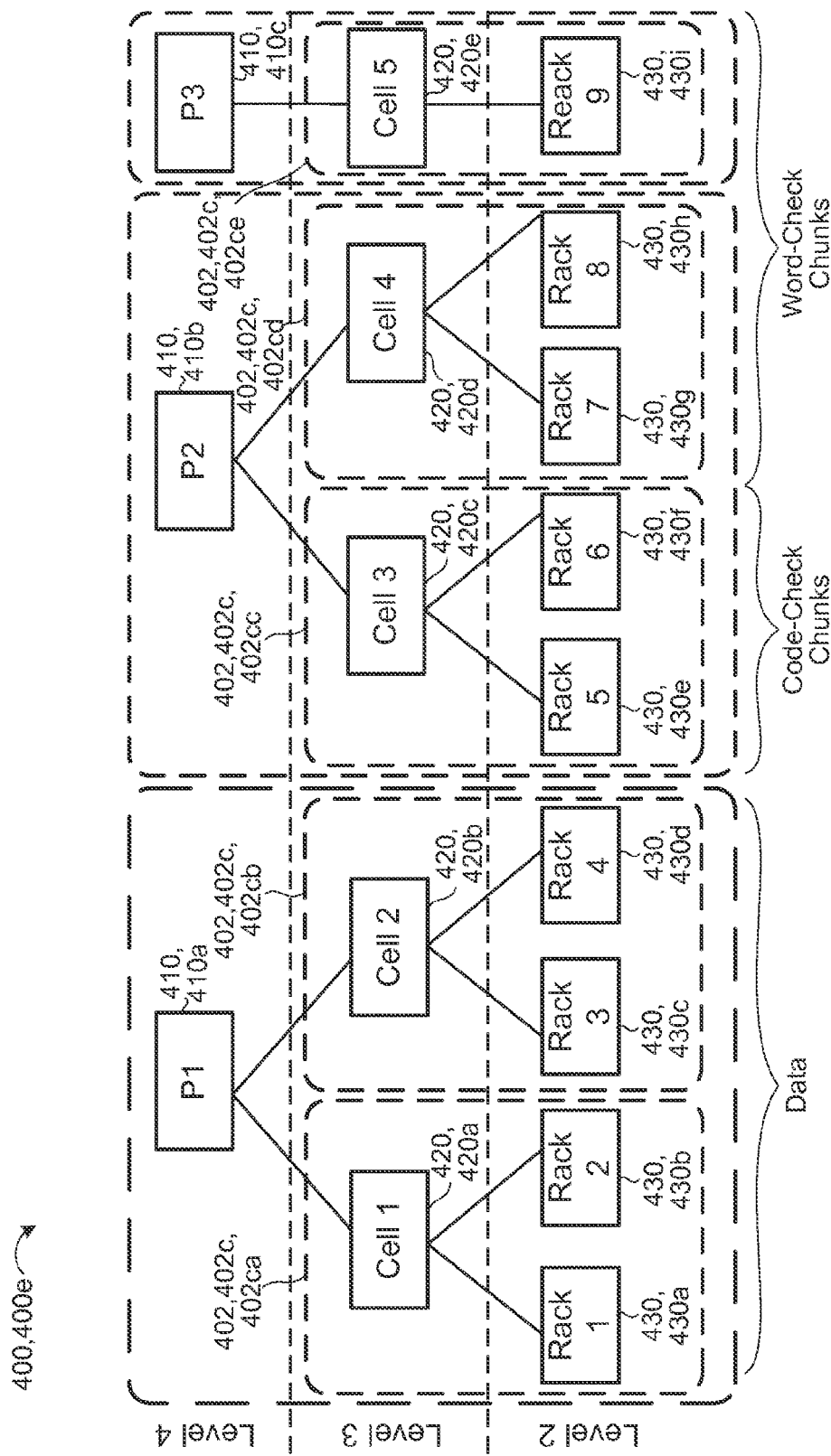

Referring to FIGS. 4D and 4E, the effective redundancy for erasure-encoded files is more complicated, since the system 100 may not simply reduce the chunks 330 and count the number of unique system domains in the stripe 320.

FIG. 4D illustrates an exemplary system hierarchy 400d for a Reed-Solomon erasure encoded file 310. Consider a stripe 320 having two code chunks 330nC and four data chunks 330nD totaling six chunks 330. The Reed-Solomon encoding 313a allows for the loss of up to the total number of code chunks 330nC or any combination of code chunks 330nC or data chunks 330nD, where the file 310 may still be reconstructed from the remaining data chunk(s) 330nD and/or code chunk(s) 330nC. In this case, the system 100 may lose up to two chunks 330 and still be reconstructable in full. The chunks 330 are distributed among six racks R1-R6, 430a-430f (in Level 2), which are in turn distributed among four cells 420a-d (e.g., in level 3). As shown, the first rack 430a and the second rack 430b depend on the first cell 420a. The third rack 430c depends on the second cell 420b, and the fourth rack 430d and the fifth rack 430e depend on the third cell 420c. Finally, the sixth rack 430f depends on the fourth cell 420d. In addition, the example includes three distribution center modules 410a-c. The first cell 420a and the second cell 420b depend on a first distribution center module 410a. The third cell 420c depends on a second distribution center module P2, 410b, and the fourth cell 420d depends on a third distribution center module 410c. Therefore, when the curator 210 determines the effective redundancy at level 2 (i.e., the rack level), the curator 210 considers how many system domains 402 may be removed and the system 100 would still be capable of reading data 312 from the stripe 320. In this example, the system 100 may remove any two racks 430a-f and still be capable of reading the data 312. However, if the system 100 removes a third rack 430a-f, then the system 100 is unable to read the data 312 to reconstruct the stripe 320. Therefore, the efficient redundancy equals 3 at the rack level (level 2); because the stripe 320 is unreadable if the system 100 loses three racks 430a-f. As previously mentioned, the system 100 may lose up to two chunks 330 and still be capable of reconstructing the stripe 320.

The curator 210 may determine the effective redundancy at the cell level (i.e., bus duct level or level 3) by hypothetically removing the cell 420 that contain the largest number of chunks 330 of a stripe 320 (to assume the worst case) compared to the other cell(s) 420 having the remaining chunks 330 of the stripe 320. Referring to the example shown in FIG. 4D, the curator 210 hypothetically removes the cell 420 containing the largest number of chunks 330 compared to the other cells 420. In this case, the first cell 420a (system domain 402ca) and the third cell 420c (system domain 402cc) have the largest number of chunks 330, so the curator 210 selects (e.g., randomly or deterministically) which cell 420 to remove for determining the effective redundancy at that level. Once the curator 210 removes one of the cells 420 or level 3 system domains 402c, the system 100 is left with either the first cell 420a or the third cell 420c and is still capable of reconstructing the stripe 320. The system 100 then considers removing the other one of the first cell 420a or the third cell 420c, which results in four unavailable chunks 330 (i.e., 4>3, 3 being the number of unavailable chunks 330 that render the system 100 incapable of reading the stripe 320), which means the stripe 320 is unreadable after losing two cells 420 or two system domains 402, 402c. Therefore, the effective redundancy at the cell level (level 3) equals 2, because the system 100 is incapable of reconstructing the stripe 320 when two cells 420 or level 3 system domains 402c are in an inactive state.

Next the curator 210 considers the effective redundancy at the distribution center module (level 4). The same considerations applied to level 3 are also applied to level 4. Therefore, the system 100 removes the distribution center modules 410 that include the largest number of chunks 330 compared to the other distribution center modules 410 that have the remaining chunks 330 of the stripe 310. Referring back to the example of FIG. 4D, if the system 100 removes the first distribution center module 410a then three chunks 330 of the stripe 320 are no longer available for reconstructing the stripe 320, causing the system 100 to be incapable of reading the stripe 320. Therefore, the effective redundancy at the distribution center module level equals one, since after losing one distribution center module 410, the stripe 320 is unreadable.

FIG. 4E illustrates an exemplary system hierarchy 400e for a nested encoded file 310. As previously described with reference to FIGS. 3E and 3F, nested encoded files 310 include data chunks 330nD, code-check chunks 330nCC, word-check chunks 330nWCC, and code-check-word-check chunks 330nCCWC. In some examples, a stripe 320 includes four data chunks 330nD arranged in two columns of two chunks 330, where each column is protected by one code-check chunk 330nCC (for a total of two code checks) and the data chunks 330nD are protected by three word-check chunks 330nWC. Referring also to the example in FIG. 4E, the first through fourth racks 430a-d include the data chunks 330nD, the fifth and sixth racks 430e, 430f include the code-check chunks 330nCC, and the seventh through ninth racks 430g-430i include the word-check chunks 330nWCC (the curator 210 does not consider the code-check-word-check chunks 330nCCWC for determining the effective redundancy of nested encoded files 310).

At each system level, for the nested encoded file 310, the curator 210 may determine the effective redundancy for column-based reconstruction or for the stripe-based reconstruction, or both. For column-based reconstruction, the curator 210 only considers data chunks 330nD and code-check chunks 330nCC. In some examples, the curator 210 may ignore the code-check chunks 330nCC when determining the effective redundancy of the entire stripe 320. In some implementations, the curator 210 considers which code-check chunks 330nCC goes with which columns C, when determining the effective redundancy of the entire stripe 320. For example, if the system 100 loses a data chunk 330nD in a first column C1 and a code-check chunk 330nCC in a second column C2, the stripe 320 is fine and reconstructable. Accordingly, the curator 210 may consider the "geometry" of the chunks 330 in the nested stripe 320 when determining the effective redundancy value ER.

At level 2, i.e., the rack level, the curator 210 determines the effective redundancy of a column C by considering data chunks 330nD stored on storage devices 114 associated with the first through fourth racks 430a-d and code-check chunks 330nCC stored on storage devices 114 associated with the fifth and sixth racks 430e, 430f. As stated in the example, each column C includes two data chunks 330nD and one code-check chunk 330nCC, totaling three chunks 330. Thus, to reconstruct the column C, the system 100 needs two available chunks 330 (i.e., chunks 330 stored on devices in the active state). The system 100 is incapable of reconstructing the column C if two or more chunks 330 are not available. Therefore, the curator 210 determines that the effective redundancy for column-based reconstruction at level 2 system domains 402 equals 2, since the system 100 is not capable of reconstructing the column if 2 racks are inactive. Similarly, the curator 210 makes the same considerations for determining the column-based reconstruction at level 3 and level 4 system domains 402. An effective redundancy for column-based reconstruction at level 3 system domains 402 equals 2, assuming the data chunks 330 from each column C are stored in different cells 420, and an effective redundancy for column-based reconstruction at level 4 system domains 402 equals 1.

Moreover, the curator 210 determines the effective redundancy of the stripe 320 by considering data chunks 330nD stored on storage devices 114 associated with the first through fourth racks 430a-d and word-check chunks 330nWCC stored on storage devices 114 associated with the seventh through ninth racks 430g-i. In some examples, the curator 210 ignores code-check chunks 330nC when determining the effective redundancy value ER in general; while in other examples, the curator 210 considers code-check chunks 330nC when determining a column-based effective redundancy value ER. Thus, to reconstruct the stripe 320, the system 100 needs at least four available chunks 330 (i.e., chunks 330 stored on devices in the active state). The system 100 is incapable of reconstructing the stripe 320 if four or more chunks 330 are not available. Therefore, the system 100 determines that the effective redundancy for stripe-based reconstruction at level 2 system domains 402 equals 4, since the system 100 is not capable of reconstructing the stripe 320 if four racks 430a-d are inactive. The curator 210 may consider code chunks 330nC as well when determining the effective redundancy of the stripe 320. Moreover, the curator 210 may consider the geometry of the chunks 330 (e.g., which column C the chunks 330 reside in) when determining the effective redundancy value ER, because a loss of a data chunk 330nD in the first column C1 and a code-check chunk 330nCC in the second column C2, assuming no other losses, still allows reconstruction of the stripe 320 based on a column C alone, whereas losing a data chunk 330nD and a code-check chunk 330nCC in the same column C may prevent reconstruction of the stripe 320. Some geometries of losses (i.e., losses of chunks 330 in various columns C) may disallow column based reconstructions, which is faster than other types of reconstructions.

Similarly, the curator 210 makes the same considerations for determining the stripe-based reconstruction at level 3 and level 4 system domains 402. In the example shown, an effective redundancy for stripe-based reconstruction at level 3 system domains 402 equals 2, and an effective redundancy for stripe-based reconstruction at level 4 system domains 402 equals 1.

Figure 5:
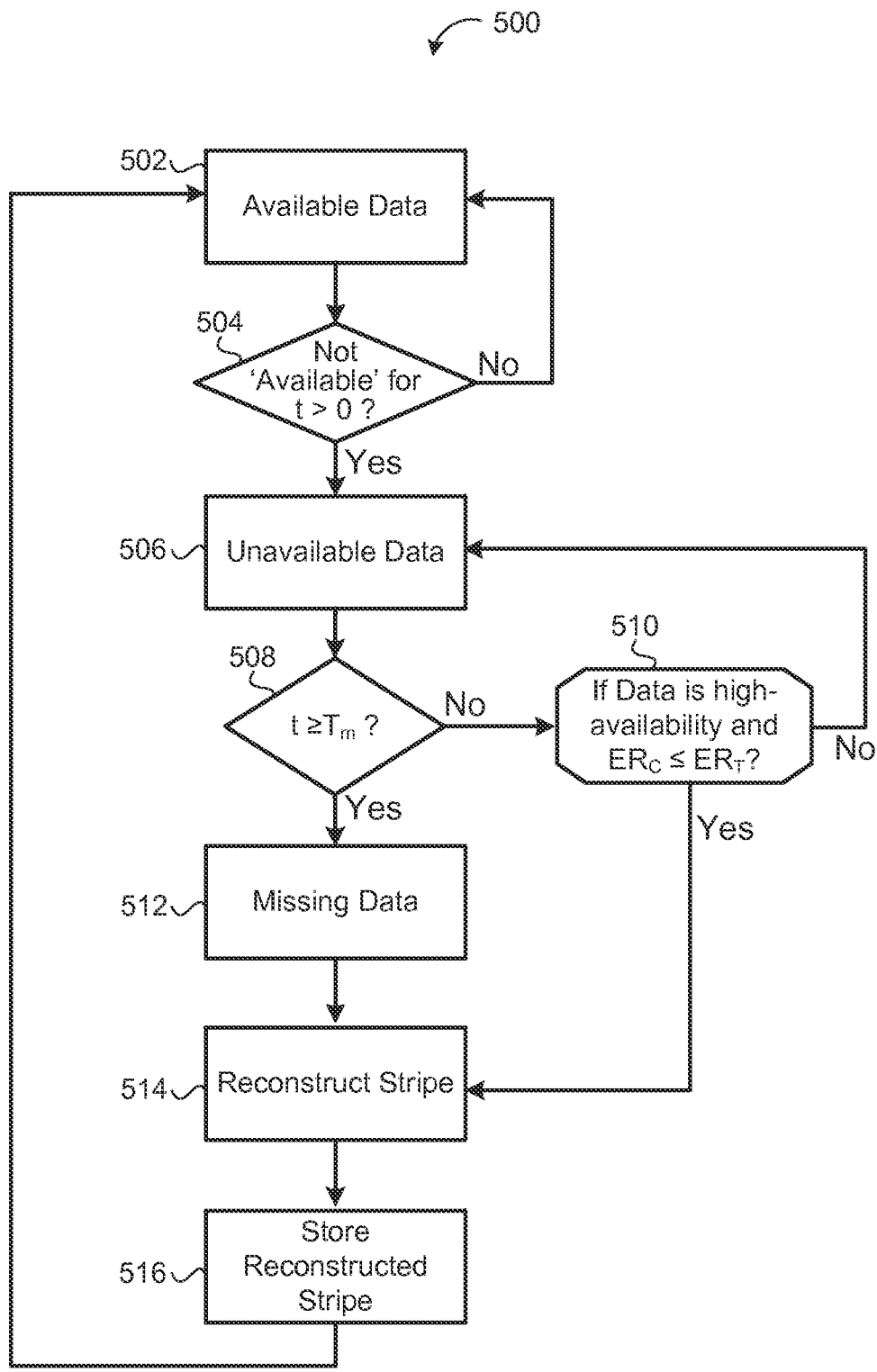
FIGS. 5-7 are schematic views of exemplary arrangements of operations for prioritizing data for recovery in a distributed storage system.

Referring to FIG. 5, in some implementations, the system 100 (e.g., the curator 210) prioritizes data 312 for recovery. The data 312 stored on the storage devices 114 may have one of three states, an available state, an unavailable state, and a missing state. When the data 312 is initially stored on the storage devices 114, it is in the available state as shown in block 502. When data 312 is in the available state, a user/client 120 may access the data 312. However, when the data 312 is in the unavailable state or the missing state, the user/client 120 may not access the data 312, and the system 100 may reconstruct the data 312 to make it available to the user/client 120. The unavailable and missing states of the data 312 may be due to the inactive state of the system domain 402. Therefore, if data 312 is associated with a system domain 402 that is in the inactive state, the data 312 may be in the unavailable state or the missing state. Data 312 may become unavailable or missing for other reasons as well. Referring to decision block 504, the curator 210 determines if the data 312 becomes unavailable. Unavailable data 312 is any data 312 that is not available for a time period greater than zero. The unavailable state, at block 506, is a transition state between the available state (block 502) and the missing state (block 512). Data 312 that is unavailable for a threshold period of time $T_m$ is unavailable data 312 (e.g., $0<t<T_m$, where t is the time that the data 312 is unavailable, and $T_m$ is the threshold time). In some examples, $T_m$ equals 15 to 30 minutes. At decision block 508, when $t \le T_m$, then the data 312 is considered missing and transitions to the missing state (block 512). The unavailable data 312 is data 312 considered unavailable because it might be available within the threshold time period ($0<t<T_m$) due to a quick system failure or maintenance. However, if the system failure or maintenance lasts longer than the threshold time $T_m$, then the data 312 is considered missing and the system 100 may reconstruct the missing data 312 at block 514 (making it available once again). The curator 210 may periodically update the states of the data 312 including the current effective redundancies $ER_C$ of the stripes 320.

In some implementations, the curator 210 identifies data 312 as either high-availability data 312a or low-availability data 312b and reconstructs high-availability data 312a that has a current effective redundancy value $ER_C$ less than a threshold effective redundancy value $ER_T$ (i.e., effective redundancy value), without considering the threshold time $T_m$ before the data 312 is considered missing. In effect, this speeds up reconstructing certain high-availability data 312a that may be at risk of becoming lost. Therefore, considering block 508, when $t \ge T_m$ is false, i.e., the data 312 is still in the unavailable state, the curator 210 determines if the data 312 is high-availability data 312a and if the effective redundancy ER of the data 312 (i.e., of the stripe 320) is less than the threshold effective redundancy value ER ($ER_C \le ER_T$?) at block 510. If the data 312 is high-availability data 312a and $ER_C \le ER_T$, then the curator 210 initiates reconstruction of the data 312a, bypassing the condition at block 508 ($t \ge T_m$). In some examples, the curator 210 does not update the state of the data 312 before reconstructing the data 312, while in other examples, the curator 210 may transition the data 312 from the unavailable state to the missing state at block 512, which may flag the data 312 for reconstruction. However, if the data 312 is not high-availability data 312a and the current effective redundancy value $ER_C$ of the data 312 is not less than or equal to the threshold effective redundancy value $ER_T$, then the data 312 remains in the unavailable state at block 506. Bypassing the $t \ge T_m$ condition of block 508 allows the curator 210 to prioritize the data 312 that is high-availability by allowing the system 100 to reconstruct high-availability data 312a that has reached the threshold effective redundancy value $ER_T$ before low-availability data 312b and before the high-availability data 312a is lost without being reconstructed. The threshold effective redundancy value $ER_T$ may be a configuration option of the system 100. In general, the effective redundancy value ER may be based on a system level, its state, the encoding type of the stripe 320, and the state of the chunks 330 in the stripe 320 (e.g., available, unavailable, or missing). The effective redundancy value ER may not indicate how many chunks 330 of a stripe 320 may be lost, but rather how many system domains 402 can be lost, while still maintaining redundancy (allowing reconstruction) of the stripe 320. Losing a single additional chunk 330 may not impact the current effective redundancy value $ER_C$.

In some implementations, the effective redundancy value ER for a stripe 320 when classified as high-availability is always less than or equal to the effective redundancy value ER for that stripe 320, when classified as low-availability. As an example, consider three replicated chunks 330 of a stripe 320 in different system domains 402. A first chunk 330 is unavailable for $t \ge T_m$. A second chunk 330 is unavailable for $t < T_m$; and a third chunk 330 is available. If the chunks 330 are high-availability chunks 330a, the current effective redundancy value $ER_C$ is one, whereas, if the chunks 330 are low-availability chunks 330b, the current effective redundancy value $ER_C$ is two, because the second missing chunk 330 was not unavailable for $t \geq T_m$. When a stripe 320 (and its chunks 330) is classified as high-availability, its effective redundancy value ER is determined more aggressively by considering chunks 330 missing for $t < T_m$, resulting in quicker reconstruction when that stripe 320 becomes at risk of becoming lost.

Figure 6:
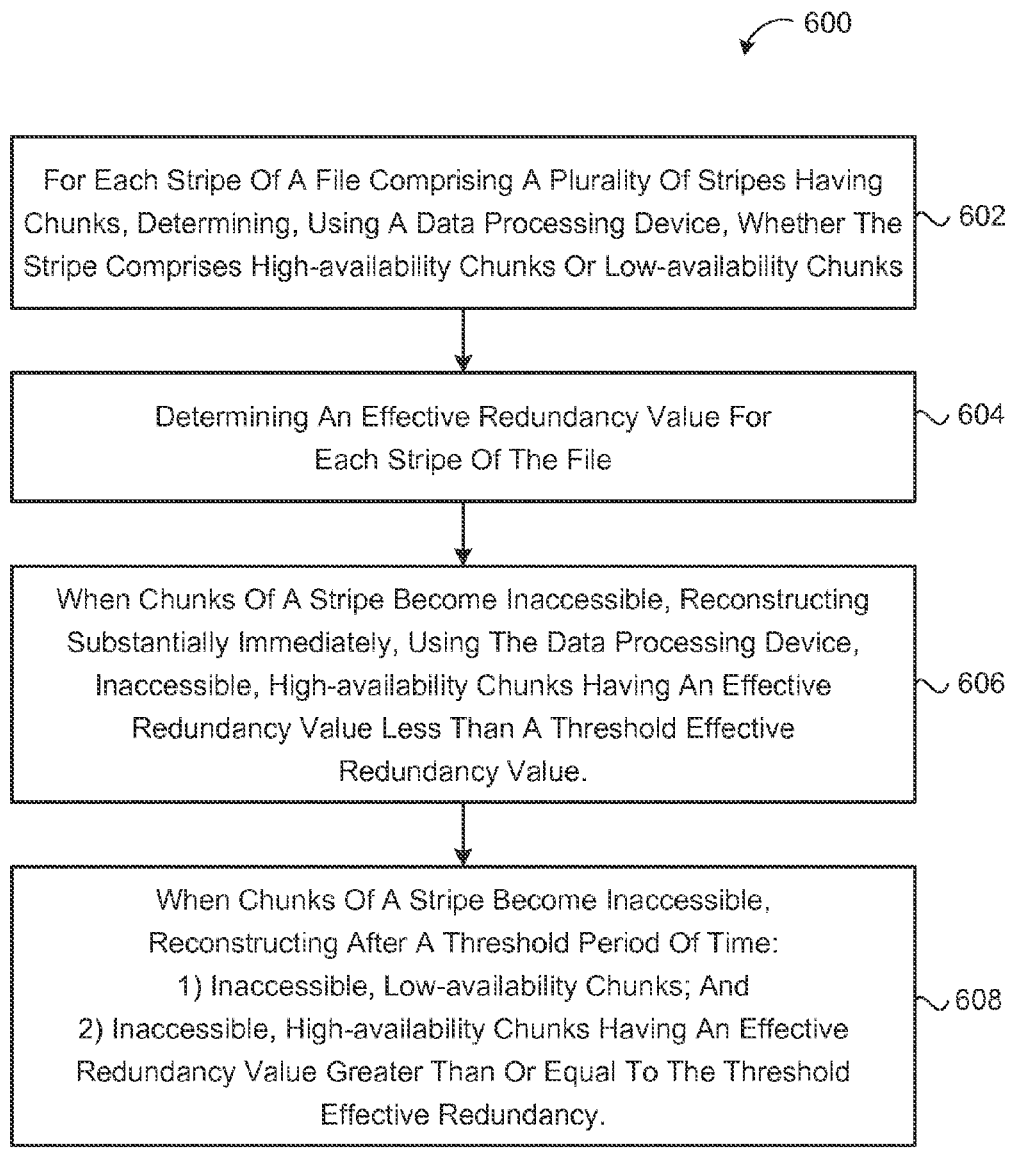

Referring to FIG. 6, in some implementations, a method 600 of prioritizing data 312 for recovery in a distributed storage system 100 includes, for each stripe 320 of a file 310 that includes a plurality of stripes 320 having chunks 330, determining 602, using a data processing device, whether the stripe 320 includes high-availability chunks 330a or low-availability chunks 330b. Files 310 may be classified as high-availability or low-availability. The stripes 320 of a file and corresponding chunks 330 of the stripes 320 may be classified according as high-availability or low-availability. The method 600 also includes determining 604, using the data processing device, an effective redundancy value ER for each stripe 320 of the file 310. The effective redundancy value ER is based on the chunks 330 and any system domains 402 associated with the corresponding stripe 320. The distributed storage system 100 has a system hierarchy 400 including system domains 402. Moreover, each system domain 402 has an active state or an inactive state. Chunks 330 of a stripe 320 associated with a system domain 402 in the active state are accessible, whereas chunks 330 of a stripe 320 associated with a system domain 402 in the inactive state are inaccessible. Chunks 330 may become inaccessible for other reasons as well, and inaccessibility may not be directly correlated to the active/inactive state of a system domain 402.

When chunks 330 of a stripe 320 become inaccessible, the method 600 includes reconstructing 606 substantially immediately, using the data processing device, inaccessible, high-availability chunks 330a having an effective redundancy value ER less than a threshold effective redundancy value $ER_T$. Moreover, when chunks 330 of a stripe 320 become inaccessible, the method also includes reconstructing 608 after a threshold period of time: 1) inaccessible, low-availability chunks 330b; and 2) inaccessible, high-availability chunks 330a having an effective redundancy value ER greater than or equal to the threshold effective redundancy $ER_T$. Therefore, certain high-availability chunks 330a at high risk of becoming lost (based on the effective redundancy value ER) receive relatively quicker reconstruction than low-availability chunks 330b or other high-availability chunks 330a that are not at high risk of becoming lost. Other parameters may be used, in addition to or as an alternative to the threshold period of time, to trigger reconstruction of an inaccessible chunk 330. For example, a client 120 may request data 312 (e.g., chunks 330) from a memory device 114 of a host machine 110 and not find the data 312. In response to not finding the data 312, the client 120 may notify the curator 210 of the inaccessible data 312. If the curator 210 confirms that the data 312 is inaccessible (e.g., unavailable for $t < T_m$ or missing (unavailable for $t \geq T_m$)), the curator 210 may initiate reconstruction of the data 312 without a delay (e.g., without waiting the threshold period of time, such as 15 or 30 minutes).

In some implementations, the method 600 further includes updating the effective redundancy value ER for each stripe 320 of the file 310 associated with a system domain 402 when the system domain 402 is in the inactive state. The threshold period of time may be between about 15 minutes and about 30 minutes.

The system hierarchy 400 may include system levels. The system levels include first, second, third, and fourth system levels. The first system level (level 1) corresponds to host machines 110 of data processing devices 112, non-transitory memory devices 114, or network interface controllers 116. Each host machine 110 has a system domain 402. The second system level (level 2) corresponds to power deliverers 434, communication deliverers 436, or cooling deliverers 432 of racks 430 housing the host machines 110. Each power deliverer 434, communication deliverer 436, or cooling deliverer 432 of the rack 430 has a system domain 402. The third system level (level 3) corresponds to power deliverers 424, communication deliverers 426, or cooling deliverers 422 of cells 420 having associated racks 430. Each power deliverer 424, communication deliverer 426, or cooling deliverer 422 of the cell 420 has a system domain 402. The fourth system level (level 4) corresponds to a distribution center module 410 of the cells 420, each distribution center module 410 has a system domain 402.

In some examples, for each stripe 320, the method 600 includes determining the effective redundancy value ER for each system level. Determining the effective redundancy value for a replicated stripe 330n having replica chunks 330 includes identifying a number of unique system domains 402 having at least one available replica chunk 330 at a corresponding system level. Determining the effective redundancy value for an encoded stripe 320 having data chunks 330nD and code chunks 330nC at the second system level includes identifying a number of unique system domains 402 within the second system level capable of being inactive while maintaining data accessibility. In addition, determining the effective redundancy value for an encoded stripe 320 having data chunks 330nC and code chunks 330nC at the third or fourth system level includes identifying a system domain 402 within the third or fourth level capable of being inactive while maintaining data accessibility and having the largest number of chunks 330 compared to the remaining system domains 402. Additionally, when more than one system domains 402 has the largest number of chunks 330, the method 600 includes randomly selecting one of the system domains 402.

In some implementations, determining the effective redundancy value for a nested code stripe having data chunks 330nD, code-check chunks 330nCC, and word-check chunks 330nWCC further includes determining one of a column-effective redundancy or a stripe-effective redundancy. Determining a column-effective redundancy includes identifying a number of unique chunks 330 within a column C capable of being reconstructed from other chunks 330 within the column C; and determining a stripe-effective redundancy including identifying a number of unique chunks 330 within a stripe 320 capable of being reconstructed from other chunks 330 within the stripe 320.

Figure 7:
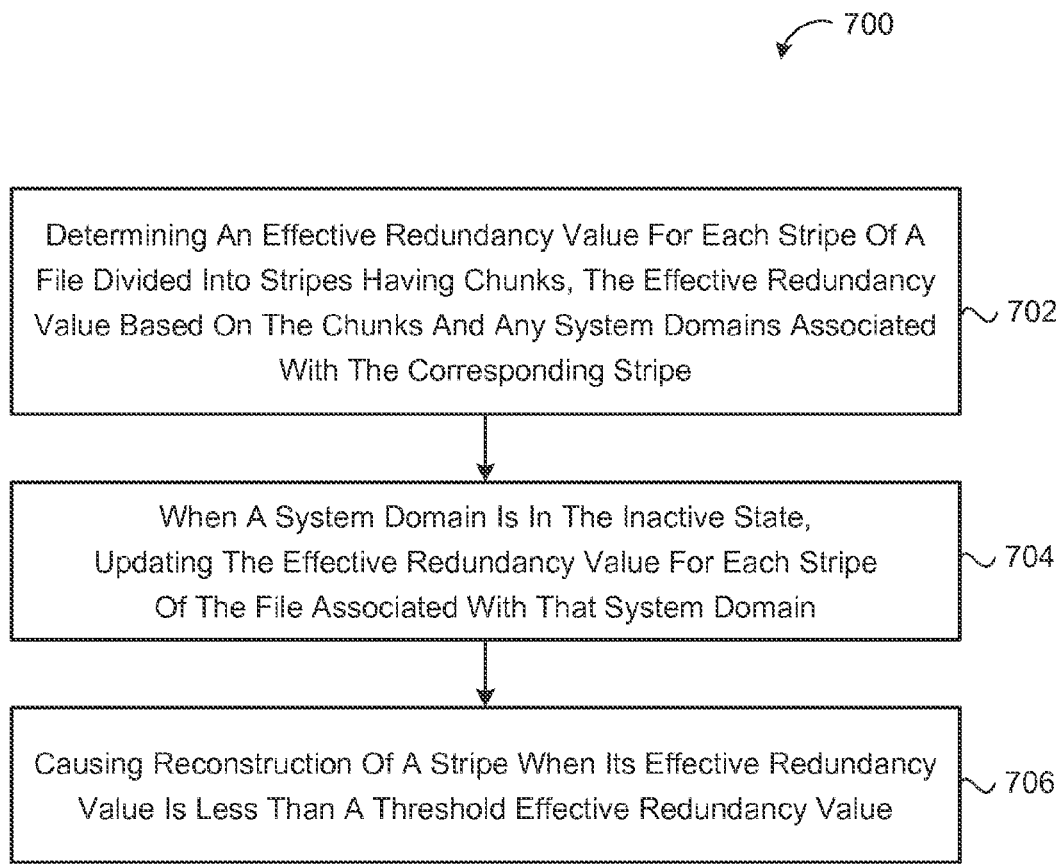

Referring to FIG. 7, in some implementations, a method 700 of prioritizing data 312 for recovery in a distributed storage system 100 includes determining 702, using a computing processor, an effective redundancy value for each stripe 320 of a file 310, the file 310 divided into stripes 320 having chunks 330. The effective redundancy value is based on the chunks 330 and any system domains 402 associated with the corresponding stripe 320. When a system domain 402 is in the inactive state, the method 700 includes updating 704 the effective redundancy value for each stripe 320 of the file 310 associated with that system domain 402. In addition, the method 700 includes causing 706 reconstruction of a stripe 320 when its effective redundancy value is less than a threshold effective redundancy value. In some examples, the method 700 further includes, for each stripe 320, determining the effective redundancy value for each system level.

In some implementations, the method 700 further includes determining whether the stripe 320 includes high-availability chunks 330 or low-availability chunks 330, and delaying reconstruction of low-availability chunks 330 (e.g., delaying reconstruction of low-availability chunks 330 for a period of between about 15 minutes and about 30 minutes).

Various implementations of the systems and techniques described here can be realized in digital electronic circuitry, integrated circuitry, specially designed ASICs (application specific integrated circuits), computer hardware, firmware, software, and/or combinations thereof. These various implementations can include implementation in one or more computer programs that are executable and/or interpretable on a programmable system including at least one programmable processor, which may be special or general purpose, coupled to receive data and instructions from, and to transmit data and instructions to, a storage system, at least one input device, and at least one output device.

These computer programs (also known as programs, software, software applications or code) include machine instructions for a programmable processor and can be implemented in a high-level procedural and/or object-oriented programming language, and/or in assembly/machine language. As used herein, the terms "machine-readable medium" and "computer-readable medium" refer to any computer program product, apparatus and/or device (e.g., magnetic discs, optical disks, memory, Programmable Logic Devices (PLDs)) used to provide machine instructions and/or data to a programmable processor, including a machine-readable medium that receives machine instructions as a machine-readable signal. The term "machine-readable signal" refers to any signal used to provide machine instructions and/or data to a programmable processor.

Implementations of the subject matter and the functional operations described in this specification can be implemented in digital electronic circuitry, or in computer software, firmware, or hardware, including the structures disclosed in this specification and their structural equivalents, or in combinations of one or more of them. Moreover, subject matter described in this specification can be implemented as one or more computer program products, i.e., one or more modules of computer program instructions encoded on a computer readable medium for execution by, or to control the operation of, data processing apparatus. The computer readable medium can be a machine-readable storage device, a machine-readable storage substrate, a memory device, a composition of matter affecting a machine-readable propagated signal, or a combination of one or more of them. The terms "data processing apparatus", "computing device" and "computing processor" encompass all apparatus, devices, and machines for processing data, including by way of example a programmable processor, a computer, or multiple processors or computers. The apparatus can include, in addition to hardware, code that creates an execution environment for the computer program in question, e.g., code that constitutes processor firmware, a protocol stack, a database management system, an operating system, or a combination of one or more of them. A propagated signal is an artificially generated signal, e.g., a machine-generated electrical, optical, or electromagnetic signal that is generated to encode information for transmission to suitable receiver apparatus.

A computer program (also known as an application, program, software, software application, script, or code) can be written in any form of programming language, including compiled or interpreted languages, and it can be deployed in any form, including as a stand-alone program or as a module, component, subroutine, or other unit suitable for use in a computing environment. A computer program does not necessarily correspond to a file in a file system. A program can be stored in a portion of a file that holds other programs or data (e.g., one or more scripts stored in a markup language document), in a single file dedicated to the program in question, or in multiple coordinated files (e.g., files that store one or more modules, sub programs, or portions of code). A computer program can be deployed to be executed on one computer or on multiple computers that are located at one site or distributed across multiple sites and interconnected by a communication network.

The processes and logic flows described in this specification can be performed by one or more programmable processors executing one or more computer programs to perform functions by operating on input data and generating output. The processes and logic flows can also be performed by, and apparatus can also be implemented as, special purpose logic circuitry, e.g., an FPGA (field programmable gate array) or an ASIC (application specific integrated circuit).

Processors suitable for the execution of a computer program include, by way of example, both general and special purpose microprocessors, and any one or more processors of any kind of digital computer. Generally, a processor will receive instructions and data from a read only memory or a random access memory or both. The essential elements of a computer are a processor for performing instructions and one or more memory devices for storing instructions and data. Generally, a computer will also include, or be operatively coupled to receive data from or transfer data to, or both, one or more mass storage devices for storing data, e.g., magnetic, magneto optical disks, or optical disks. However, a computer need not have such devices. Moreover, a computer can be embedded in another device, e.g., a mobile telephone, a personal digital assistant (PDA), a mobile audio player, a Global Positioning System (GPS) receiver, to name just a few. Computer readable media suitable for storing computer program instructions and data include all forms of non-volatile memory, media and memory devices, including by way of example semiconductor memory devices, e.g., EPROM, EEPROM, and flash memory devices; magnetic disks, e.g., internal hard disks or removable disks; magneto optical disks; and CD ROM and DVD-ROM disks. The processor and the memory can be supplemented by, or incorporated in, special purpose logic circuitry.

To provide for interaction with a user, one or more aspects of the disclosure can be implemented on a computer having a display device, e.g., a CRT (cathode ray tube), LCD (liquid crystal display) monitor, or touch screen for displaying information to the user and optionally a keyboard and a pointing device, e.g., a mouse or a trackball, by which the user can provide input to the computer. Other kinds of devices can be used to provide interaction with a user as well; for example, feedback provided to the user can be any form of sensory feedback, e.g., visual feedback, auditory feedback, or tactile feedback; and input from the user can be received in any form, including acoustic, speech, or tactile input. In addition, a computer can interact with a user by sending documents to and receiving documents from a device that is used by the user; for example, by sending web pages to a web browser on a user's client device in response to requests received from the web browser.

One or more aspects of the disclosure can be implemented in a computing system that includes a backend component, e.g., as a data server, or that includes a middleware component, e.g., an application server, or that includes a frontend component, e.g., a client computer having a graphical user interface or a Web browser through which a user can interact with an implementation of the subject matter described in this specification, or any combination of one or more such backend, middleware, or frontend components. The components of the system can be interconnected by any form or medium of digital data communication, e.g., a communication network. Examples of communication networks include a local area network ("LAN") and a wide area network ("WAN"), an inter-network (e.g., the Internet), and peer-to-peer networks (e.g., ad hoc peer-to-peer networks).

The computing system can include clients and servers. A client and server are generally remote from each other and typically interact through a communication network. The relationship of client and server arises by virtue of computer programs running on the respective computers and having a client-server relationship to each other. In some implementations, a server transmits data (e.g., an HTML page) to a client device (e.g., for purposes of displaying data to and receiving user input from a user interacting with the client device). Data generated at the client device (e.g., a result of the user interaction) can be received from the client device at the server.

While this specification contains many specifics, these should not be construed as limitations on the scope of the disclosure or of what may be claimed, but rather as descriptions of features specific to particular implementations of the disclosure. Certain features that are described in this specification in the context of separate implementations can also be implemented in combination in a single implementation. Conversely, various features that are described in the context of a single implementation can also be implemented in multiple implementations separately or in any suitable sub-combination. Moreover, although features may be described above as acting in certain combinations and even initially claimed as such, one or more features from a claimed combination can in some cases be excised from the combination, and the claimed combination may be directed to a sub-combination or variation of a sub-combination.

Similarly, while operations are depicted in the drawings in a particular order, this should not be understood as requiring that such operations be performed in the particular order shown or in sequential order, or that all illustrated operations be performed, to achieve desirable results. In certain circumstances, multi-tasking and parallel processing may be advantageous. Moreover, the separation of various system components in the embodiments described above should not be understood as requiring such separation in all embodiments, and it should be understood that the described program components and systems can generally be integrated together in a single software product or packaged into multiple software products.

A number of implementations have been described. Nevertheless, it will be understood that various modifications may be made without departing from the spirit and scope of the disclosure. Accordingly, other implementations are within the scope of the following claims. For example, the actions recited in the claims can be performed in a different order and still achieve desirable results.

What is claimed is:

1. A method of prioritizing data for recovery in a distributed storage system, the method comprising:
    for each stripe of a file comprising a plurality of stripes having chunks, determining, using a data processing device, whether the stripe comprises high-availability chunks or low-availability chunks;
    determining, using the data processing device, an effective redundancy value for each stripe of the file, the effective redundancy value based on the chunks and any system domains associated with the corresponding stripe, the distributed storage system having a system hierarchy comprising system domains, each system domain having an active state or an inactive state, wherein chunks of a stripe associated with a system domain in the active state are accessible, and chunks of a stripe associated with a system domain in the inactive state are inaccessible; and
    determining, using the data processing device, that the chunks of a stripe have become inaccessible, and in response to the determining that the chunks of the stripe have become inaccessible:
        reconstructing, using the data processing device, inaccessible, high-availability chunks having an effective redundancy value less than a threshold effective redundancy value substantially immediately; and
        reconstructing, using the data processing device, after a threshold period of time:
            inaccessible, low-availability chunks; and
            inaccessible, high-availability chunks having an effective redundancy value greater than or equal to the threshold effective redundancy value.

2. The method of claim 1, further comprising updating the effective redundancy value for each stripe of the file associated with a system domain when the system domain is in the inactive state.

3. The method of claim 1, wherein the threshold period of time comprises between about 15 minutes and about 30 minutes.

4. The method of claim 1, wherein the system hierarchy comprises system levels comprising:
    a first system level corresponding to host machines of data processing devices, non-transitory memory devices, or network interface controllers, each host machine having a system domain;
    a second system level corresponding to power deliverers, communication deliverers, or cooling deliverers of racks housing the host machines, each power deliverer, communication deliverer, or cooling deliverer of the rack having a system domain;
    a third system level corresponding to power deliverers, communication deliverers, or cooling deliverers of cells having associated racks, each power deliverer, communication deliverer, or cooling deliverer of the cell having a system domain; and
    a fourth system level corresponding to a distribution center module of the cells, each distribution center module having a system domain.

5. The method of claim 4, further comprising, for each stripe, determining the effective redundancy value for each system level.

6. The method of claim 5, wherein determining the effective redundancy value for a replicated stripe having replica chunks comprises identifying a number of unique system domains having at least one available replica chunk at a corresponding system level.

7. The method of claim 5, wherein determining the effective redundancy value for an encoded stripe having data chunks and code chunks at the second system level comprises identifying a number of unique system domains within the second system level capable of being inactive while maintaining data accessibility.

8. The method of claim 5, wherein determining the effective redundancy value for an encoded stripe having data chunks and code chunks at the third or fourth system level comprises identifying a system domain within the third or fourth level capable of being inactive while maintaining data accessibility and having the largest number of chunks compared to the remaining system domains.

9. The method of claim 8, wherein when more than one system domains has the largest number of chunks, randomly selecting one of the system domains.

10. The method of claim 1, wherein determining the effective redundancy value for a nested code stripe having data chunks, code-check chunks, and word-check chunks comprises:
determining one of a column-effective redundancy or a stripe-effective redundancy; wherein determining a column-effective redundancy comprises identifying a number of unique chunks within a column capable of being reconstructed from other chunks within the column; and
wherein determining a stripe-effective redundancy comprises identifying a number of unique chunks within a stripe capable of being reconstructed from other chunks within the stripe.

11. The method of claim 1, wherein the file comprises data and an availability of each chunk is based on the data or based on an owner or user of the data, the availability comprising the high-availability or the low-availability.

12. A system for prioritizing data for recovery in a distributed storage system, the system comprises:
memory hosts, each memory host having non-transitory memory;
a computer processor in communication with the memory hosts, the computer processor executing instructions to:
manage striping of files across the memory hosts, each file comprising stripes having chunks;
for each stripe of a file comprising a plurality of stripes having chunks, determine using a data processing device, whether the stripe comprises high-availability chunks or low-availability chunks;
determine an effective redundancy value for each stripe of the file, the effective redundancy value based on the chunks and any system domains associated with the corresponding stripe, the distributed storage system having a system hierarchy comprising system domains, each system domain having an active state or an inactive state, wherein chunks of a stripe associated with a system domain in the active state are accessible, and chunks of a stripe associated with a system domain in the inactive state are inaccessible; and
determine that the chunks of a stripe have become inaccessible, and in response to the determining that the chunks of the stripe have become inaccessible:
reconstruct inaccessible, high-availability chunks having an effective redundancy value less than a threshold effective redundancy value substantially immediately; and
reconstruct after a threshold period of time:
inaccessible, low-availability chunks; and
inaccessible, high-availability chunks having an effective redundancy value greater than or equal to the threshold effective redundancy value.

13. The system of claim 12, wherein the computer processor updates the effective redundancy value for each stripe of the file associated with a system domain when the system domain is in the inactive state.

14. The system of claim 12, wherein the threshold period of time comprises between 15 minutes and 30 minutes.

15. The system of claim 12, wherein the system hierarchy comprises system levels comprising:
a first system level corresponding to host machines of data processing devices, non-transitory memory devices, or network interface controllers, each host machine having a system domain;
a second system level corresponding to power deliverers, communication deliverers, or cooling deliverers of racks housing the host machines, each power deliverer, communication deliverer, or cooling deliverer of the rack having a system domain;
a third system level corresponding to power deliverers, communication deliverers, or cooling deliverers of cells having associated racks, each power deliverer, communication deliverer, or cooling deliverer of the cell having a system domain; and
a fourth system level corresponding to a distribution center module of the cells, each distribution center module having a system domain.

16. The system of claim 15, wherein the computer processor determines for each stripe the effective redundancy value for each system level.

17. The system of claim 15, wherein the computer processor determines the effective redundancy value for a replicated stripe having replica chunks by identifying a number of unique system domains having at least one available replica chunk at a corresponding system level.

18. The system of claim 15, wherein the computer processor determines the effective redundancy value for an encoded stripe having data chunks and code chunks at the second system level by identifying a number of unique system domains within the second system level capable of being inactive while maintaining data accessibility.

19. The system of claim 15, wherein the computer processor determines the effective redundancy value for an encoded stripe having data chunks and code chunks at the third or fourth system level by identifying a system domain within the third or fourth level capable of being inactive while maintaining data accessibility and having the largest number of chunks compared to the remaining system domains.

20. The system of claim 19, wherein when more than one system domains has the largest number of chunks, the computer processor randomly selects one of the system domains.

21. The system of claim 12, wherein computer processor determines the effective redundancy value for a nested code stripe having data chunks, code-check chunks, and word-check chunks by:
determining one of a column-effective redundancy or a stripe-effective redundancy; wherein determining a column-effective redundancy comprises identifying a number of unique chunks within a column capable of being reconstructed from other chunks within the column; and
wherein determining a stripe-effective redundancy comprises identifying a number of unique chunks within a stripe capable of being reconstructed from other chunks within the stripe.

22. The system of claim 12, wherein the file comprises data and an availability of each chunk is based on the data or based on an owner or user of the data, the availability comprising the high-availability or the low-availability.

* * * * *